(12) United States Patent
Wu

(10) Patent No.: US 9,905,192 B2
(45) Date of Patent: Feb. 27, 2018

(54) GOA UNIT AND DRIVING METHOD, GOA CIRCUIT AND DISPLAY DEVICE

(71) Applicant: Boe Technology Group Co., Ltd., Beijing (CN)

(72) Inventor: Zhongyuan Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/122,573

(22) PCT Filed: Apr. 15, 2015

(86) PCT No.: PCT/CN2015/076640
§ 371 (c)(1),
(2) Date: Aug. 30, 2016

(87) PCT Pub. No.: WO2016/115782
PCT Pub. Date: Jul. 28, 2016

(65) Prior Publication Data
US 2017/0069286 A1 Mar. 9, 2017

(30) Foreign Application Priority Data
Jan. 20, 2015 (CN) .......................... 2015 1 0028788

(51) Int. Cl.
*G09G 5/00* (2006.01)
*G09G 5/18* (2006.01)
*G09G 3/20* (2006.01)

(52) U.S. Cl.
CPC ............... *G09G 5/003* (2013.01); *G09G 3/20* (2013.01); *G09G 5/18* (2013.01);
(Continued)

(58) Field of Classification Search
CPC ............ G09G 3/003; G09G 3/20; G09G 5/18; G09G 2300/0408; G09G 2300/0426;
(Continued)

(56) References Cited

U.S. PATENT DOCUMENTS 6,845,140 B2    1/2005  Moon et al.
7,679,597 B2    3/2010  Shin
(Continued)

FOREIGN PATENT DOCUMENTS

CN    101145398 A     3/2008
CN    102779478 A    11/2012
(Continued)

OTHER PUBLICATIONS

International Search Report and Written Opinion in PCT/CN2015/076640 dated Oct. 10, 2015, with English translation. 15 pages.
(Continued)

*Primary Examiner* — Lixi C Simpson
(74) *Attorney, Agent, or Firm* — Womble Bond Dickinson (US) LLP

(57) ABSTRACT

The present disclosure provides a touch panel, a manufacturing method thereof and a touch display device. The method comprises: 1) forming touch lines, comprising: forming in the same layer gate lines and a plurality of first touch lines, each first touch line being arranged intermittently in a direction of data lines and not electrically connected with the gate lines, and forming in the same layer a plurality of first connection lines and electrodes not in the same layer as the gate lines and the touch electrodes, each first connection line being used for connecting in series with an intermittent first touch line, each touch line comprising a first touch line and a plurality of first connection lines; and 2) forming touch electrodes, each touch electrode being
(Continued)

electrically connected with one or more first touch lines, one or more second touch lines, or one or more third touch lines.

20 Claims, 6 Drawing Sheets

(52) U.S. Cl.
CPC ............... *G09G 2300/0408* (2013.01); *G09G 2300/0426* (2013.01); *G09G 2300/0819* (2013.01); *G09G 2310/0267* (2013.01); *G09G 2310/0286* (2013.01); *G09G 2310/08* (2013.01); *G09G 2330/021* (2013.01)

(58) Field of Classification Search
CPC ... G09G 2300/0819; G09G 2310/0267; G09G 2310/0286; G09G 2310/08; G09G 2330/021
See application file for complete search history.

(56) References Cited

U.S. PATENT DOCUMENTS

| | | | |
|---|---|---|---|
| 2005/0104836 A1 | 5/2005 | Lin et al. | |
| 2013/0063405 A1* | 3/2013 | Zhou | G09G 3/3674 345/204 |
| 2014/0210699 A1 | 7/2014 | Liu et al. | |
| 2015/0187323 A1* | 7/2015 | Jin | G09G 5/003 345/215 |
| 2015/0206488 A1* | 7/2015 | Zhang | G09G 3/3677 345/92 |

FOREIGN PATENT DOCUMENTS

| | | |
|---|---|---|
| CN | 102831860 A | 12/2012 |
| CN | 102831861 A | 12/2012 |
| CN | 103500551 A | 1/2014 |
| CN | 103943065 A | 7/2014 |
| CN | 104021750 A | 9/2014 |
| CN | 104269134 A | 1/2015 |
| CN | 104282269 A | 1/2015 |
| KR | 20070072011 A | 7/2007 |

OTHER PUBLICATIONS

Office Action in Chinese Application No. 201510028788.1 dated Jun. 30, 2016, with English translation. 11 pages.
Office Action in Chinese Application No. 201510028788.1 dated Feb. 17, 2017, with English translation. 11 pages.

* cited by examiner

Fig. 1   - - Prior Art - -

| | |
|---|---|
| a first phase, in which a control module enables a voltage of a second control node to be equal to a voltage of a first clock signal terminal under the control of a first clock signal of the first clock signal terminal and a voltage of a first control node; a first output module enables a second voltage of a second level terminal to be equal to a voltage of a first signal output terminal under the control of the voltage of the second control node; a second output terminal enables the second voltage of the second level terminal to be equal to a voltage of a second signal output terminal under the control of the voltage of the second control node | S401 |

↓

| | |
|---|---|
| a second phase, in which an input module enables a voltage of a first signal input terminal to be equal to the voltage of the first control node under the control of a second input signal of a second signal input terminal, the first clock signal of the first clock signal terminal, a second clock signal of a second clock signal terminal, a first voltage of a first level terminal and the second voltage of the second level terminal; the first output module outputs the first voltage of the first level terminal at the first signal output terminal under the control of the second input signal of the second signal input terminal, the voltage of the first control node and the voltage of the second control node; the second output module outputs a third clock signal of a third clock signal terminal at the second signal output terminal under the control of the voltage of the first control node; a feedback module enables the first voltage of the first level terminal to be equal to a voltage of a third signal output | S402 |

↓

| | |
|---|---|
| a third phase, in which the first output module outputs the first voltage of the first level terminal at the first signal output terminal under the control of the second input signal of the second signal input terminal, the voltage of the first control node, the voltage of the second control node and a voltage of a third control node; the second output module outputs the third clock signal of the third clock signal terminal at the second signal output terminal under the control of the voltage of the first control node and the voltage of the third control node; the feedback module enables the first voltage of the first level terminal to be equal to the voltage of the third signal output terminal under the control of the voltage of the first control node and the voltage of the first signal output terminal | S403 |

↓

| | |
|---|---|
| a fourth phase, in which a reset module enables the voltage of the first control node to be equal to the second voltage of the second level terminal under the control of the first input signal of the first signal input terminal, the second clock signal of the second clock signal terminal and a third input signal of a third signal input terminal; the first signal output terminal enables the voltage of the first signal output terminal to be equal to the second voltage of the second level terminal under the control of the second control node; the second signal output terminal enables the second voltage of the second level terminal to be equal to the voltage of the second signal output terminal under the control of the voltage of the second control node | S404 |

Fig. 4

GOA UNIT AND DRIVING METHOD, GOA CIRCUIT AND DISPLAY DEVICE

RELATED APPLICATIONS

The present application is the U.S. national phase entry of PCT/CN2015/076640, with an international filing date of Apr. 15, 2015, which claims the benefit of Chinese Patent Application No. 201510028788.1, filed Jan. 20, 2015, the entire disclosures of which are incorporated herein by reference.

TECHNICAL FIELD

The disclosure relates to the field of manufacture of display, particularly to a GOA unit and a driving method, a GOA circuit and a display device.

BACKGROUND

The display is generally constituted by pixel matrixes in horizontal and longitudinal directions. When the display performs displaying, the driving circuit outputs a drive signal to perform scanning to respective pixels row by row. In addition, in some displays, the driving circuit needs to output a multi-pulse drive signal. The multi-pulse drive signal has the characteristic that the drive signal of each row is transferred row by row by at least two signals with the same clock period, the same duty ratio and the same pulse number by taking the period of the drive signal as the delay. The driving circuit that generates such a drive signal is called a multi-pulse shift register.

As shown in FIG. 1, the gate drive signal of each stage in the multi-pulse shift register in the prior art is controlled and outputted by a multi-pulse output unit 101 and an advanced unit 102. The multi-pulse output unit 101 and the advanced unit 102 consist of gate driver on array (GOA) units of the same or similar structure. The output signal of the GOA unit constituting the multi-pulse output unit 101 serves as the input signal of the GOA unit constituting the advanced unit 102. The output signal of the GOA unit constituting the advanced unit 102 has the same waveform as the output signal of the GOA unit constituting the multi-pulse output unit 101, while being delayed for ½ clock period. The output signal of the GOA unit constituting the advanced unit 102 further serves as the input signal of the GOA unit constituting the next stage multi-pulse output unit. The output signal of the GOA unit constituting the next stage multi-pulse output unit has the same waveform as the output signal of the GOA unit constituting the current stage multi-pulse output unit, which is delayed for one clock period. Finally, a multi-pulse drive signal can be obtained by inputting the output signal of the GOA unit constituting the multi-pulse output unit into a corresponding gate line as a drive signal. In the multi-pulse shift register of the prior art, the drive signals of one stage gate line are controlled and outputted by two GOA units of the same or similar structure, thus resulting in a large area and great power consumption of the gate driving circuit in the prior art.

SUMMARY

Embodiments of the disclosure provide a GOA unit and a driving method, a GOA circuit and a display device.

According to an aspect, a GOA unit is provided, which comprises an input module, a reset module, a control module, a first output module, a second output module, and a feedback module.

The input module is connected with a first signal input terminal, a second signal input terminal, a first clock signal terminal, a second clock signal terminal, a first level terminal, a second level terminal, a first control node and a third control node, for enabling a voltage of the first signal input terminal to be equal to a voltage of the first control node under the control of a second input signal of the second signal input terminal, a first clock signal of the first clock signal terminal, a second clock signal of the second clock signal terminal, a first voltage of the first level terminal, a second voltage of the second level terminal and a voltage of the third control node.

The reset module is connected with the first signal input terminal, the second clock signal terminal, the second level terminal, the first control node, the third control node and a third signal input terminal, for enabling the voltage of the first control node to be equal to the second voltage of the second level terminal under the control of a first input signal of the first signal input terminal, the second clock signal of the second clock signal terminal and a third input signal of the third signal input terminal.

The control module is connected with the first clock signal terminal, the second clock signal terminal, the first control node, the second level terminal, a second control node and the third signal input terminal, for enabling a voltage of the second control node to be equal to a voltage of the first clock signal terminal under the control of the first clock signal of the first clock signal terminal, the voltage of the first control node and the third input signal of the third signal input terminal, or enabling the voltage of the second control node to be equal to the voltage of the first clock signal terminal under the control of the second clock signal of the second clock signal terminal, the voltage of the first control node and the third input signal of the third signal input terminal, or enabling the voltage of the second control node to be equal to the second voltage of the second level terminal under the control of the voltage of the first control node.

The first output module is connected with the second signal input terminal, the first control node, the second control node, the first level terminal, the second level terminal and a first signal output terminal, for outputting the first voltage of the first level terminal at the first signal output terminal under the control of the second input signal of the second signal input terminal, the voltage of the first control node and the voltage of the second control node, or enabling a voltage of the first signal output terminal to be equal to the second voltage of the second level terminal under the control of the second control node.

The second output module is connected to the first control node, the second control node, the second level terminal, a third clock signal terminal and a second signal output terminal, for outputting a third clock signal of the third clock signal terminal at the second signal output terminal under the control of the voltage of the first control node, or enabling the second voltage of the second level terminal to be equal to a voltage of the second signal output terminal under the control of the voltage of the second control node.

The feedback module is connected with the first signal output terminal, the first control node, the second control node, the first level terminal, the second level terminal, a third signal output terminal and the third control node, for enabling a voltage of the third control node to be equal to the first voltage of the first level terminal and outputting the first voltage of the first level terminal at the third signal output terminal under the control of the voltage of the first control node, the voltage of the second control node and the voltage of the first signal output terminal.

In some embodiments, the input module comprises a first transistor, a second transistor, a third transistor, a fourth transistor and a fifth transistor. A first terminal of the first transistor is connected with the first signal input terminal, a second terminal of the first transistor is connected with the third control node, a gate of the first transistor is connected with a gate of the second transistor. A first terminal of the second transistor is connected with the third control node, a second terminal of the second transistor is connected with the first control node, the gate of the second transistor is connected with a second terminal of the third transistor. A first terminal of the third transistor is connected with the first level terminal, the second terminal of the third transistor is connected with a first terminal of the fourth transistor, a gate of the third transistor is connected with the first clock signal terminal. The first terminal of the fourth transistor is connected with a first terminal of the fifth transistor, a second terminal of the fourth transistor is connected with a second terminal of the fifth transistor, a gate of the fourth transistor is connected with the second clock signal terminal. The second terminal of the fifth transistor is connected with the second level terminal, a gate of the fifth transistor is connected with the second signal input terminal.

In some embodiments, the reset module comprises a sixth transistor, a seventh transistor, an eighth transistor, a ninth transistor and a tenth transistor. A first terminal of the sixth transistor is connected with a gate of the sixth transistor, a second terminal of the sixth transistor is connected with a first terminal of the seventh transistor, the gate of the sixth transistor is connected with the second clock signal terminal. A second terminal of the seventh transistor is connected with a first terminal of the eighth transistor, a gate of the seventh transistor is connected with a gate of the eighth transistor. The first terminal of the eighth transistor is connected with the third signal input terminal, a second terminal of the eighth transistor is connected with the second level terminal, the gate of the eighth transistor is connected with the first signal input terminal. A first terminal of the ninth transistor is connected with the first control node, a second terminal of the ninth transistor is connected with a first terminal of the tenth transistor, a gate of the ninth transistor is connected with a gate of the tenth transistor. The first terminal of the tenth transistor is connected with the third control node, a second terminal of the tenth transistor is connected with the second level terminal, the gate of the tenth transistor is connected with the second terminal of the sixth transistor.

In some embodiments, the control module comprises an eleventh transistor, a twelfth transistor, a thirteenth transistor and a fourteenth transistor. A first terminal of the eleventh transistor is connected with a gate of the eleventh transistor, a second terminal of the eleventh transistor is connected with a second terminal of the twelfth transistor, the gate of the eleventh transistor is connected with the second clock signal terminal. A first terminal of the twelfth transistor is connected with a gate of the twelfth transistor, the second terminal of the twelfth transistor is connected with a first terminal of the thirteenth transistor, the gate of the twelfth transistor is connected with the first clock signal terminal. A first terminal of the thirteenth transistor is connected with the second control node, a second terminal of the thirteenth transistor is connected with a first terminal of the fourteenth transistor, a gate of the thirteenth transistor is connected with a gate of the fourteenth transistor. The first terminal of the fourteenth transistor is connected with the third signal input terminal, a second terminal of the fourteenth transistor is connected with the second level terminal, the gate of the fourteenth transistor is connected with the first control node.

In some embodiments, the first output module comprises a first capacitor, a second capacitor, a fifteenth transistor and a sixteenth transistor. A first electrode of the first capacitor is connected with the second signal input terminal, a second electrode of the first capacitor is connected with a first electrode of the second capacitor. The first electrode of the second capacitor is connected with the first control node, a second electrode of the second capacitor is connected with a second terminal of the fifteenth transistor. A first terminal of the fifteenth transistor is connected with the first level terminal, the second terminal of the fifteenth transistor is connected with the first signal output terminal, a gate of the fifteenth transistor is connected with the first control node. A first terminal of the sixteenth transistor is connected with the first signal output terminal, a second terminal of the sixteenth transistor is connected with the second level terminal, a gate of the sixteenth transistor is connected with the second control node.

In some embodiments, the second output module comprises a seventeenth transistor and an eighteenth transistor. A first terminal of the seventeenth transistor is connected with the third clock signal terminal; a second terminal of the seventeenth transistor is connected with the second signal output terminal, a gate of the seventeenth transistor is connected with the first control node. A first terminal of the eighteenth transistor is connected with the second signal output terminal, a second terminal of the eighteenth transistor is connected with the second level terminal, a gate of the eighteenth transistor is connected with the second control node.

In some embodiments, the feedback module comprises a nineteenth transistor, a twentieth transistor, a twenty-first transistor and a twenty-second transistor. A first terminal of the nineteenth transistor is connected with the first level terminal, a second terminal of the nineteenth transistor is connected with a first terminal of the twentieth transistor, a gate of the nineteenth transistor is connected with the first control node. The first terminal of the twentieth transistor is connected with a first terminal of the twenty-first transistor, a second terminal of the twentieth transistor is connected with the second level terminal, a gate of the twentieth transistor is connected with the second control node. The first terminal of the twenty-first transistor is connected with a first terminal of the twenty-second transistor, a second terminal of the twenty-first transistor is connected with the third control node, a gate of the twenty-first transistor is connected with a gate of the twenty-second transistor. A second terminal of the twenty-second transistor is connected with the third signal output terminal, the gate of the twenty-second transistor is connected with the first signal output terminal.

In some embodiments, the transistors are all N-type transistors; or the transistors are all P-type transistors.

In some embodiments, the first clock signal of the first clock signal terminal and the second clock signal of the second clock signal terminal have opposite phases, and the first clock signal of the first clock signal terminal and the second clock signal of the second clock signal terminal both have a duty ratio of 50%.

In another aspect, a GOA circuit is provided, which comprises at least two GOA units mentioned above.

A first signal input terminal of a first stage GOA unit inputs a frame start signal, a second signal input terminal of the first stage GOA unit is connected with a first signal output terminal of a second stage GOA unit, a first signal output terminal of the first stage GOA unit is connected with a first signal input terminal of the second stage GOA unit, a third signal output terminal of the first stage GOA unit is connected with a third signal input terminal of the second stage GOA unit.

A first signal input terminal of a nth stage GOA unit is connected with a first signal output terminal of a (n−1)th stage GOA unit, a second signal input terminal of the nth stage GOA unit is connected with a first signal output terminal of a (n+1)th stage GOA unit, a third signal output terminal of the nth stage GOA unit is connected with a third signal input terminal of the (n+1)th stage GOA unit, a first signal output terminal of the nth stage GOA unit is connected with a first signal input terminal of the (n+1)th stage GOA unit, a first signal output terminal of the nth stage GOA unit is connected with a second signal input terminal of the (n−1)th stage GOA unit, a third signal input terminal of the nth stage GOA unit is connected with a third signal output terminal of the (n−1)th stage GOA unit; wherein n is a positive integer.

In another aspect, a display device comprising the GOA circuit mentioned above is provided.

In yet another aspect, a method for driving a GOA unit is provided, comprising:

a first phase, in which a control module enables a voltage of a second control node to be equal to a voltage of a first clock signal terminal under the control of a first clock signal of the first clock signal terminal and a voltage of a first control node; a first output module enables a second voltage of a second level terminal to be equal to a voltage of a first signal output terminal under the control of the voltage of the second control node; a second output module enables the second voltage of the second level terminal to be equal to a voltage of a second signal output terminal under the control of the voltage of the second control node;

a second phase, in which an input module enables a voltage of a first signal input terminal to be equal to the voltage of the first control node under the control of a second input signal of a second signal input terminal, the first clock signal of the first clock signal terminal, a second clock signal of a second clock signal terminal, a first voltage of a first level terminal and the second voltage of the second level terminal; the first output module outputs the first voltage of the first level terminal at the first signal output terminal under the control of the second input signal of the second signal input terminal, the voltage of the first control node and the voltage of the second control node; the second output module outputs a third clock signal of a third clock signal terminal at the second signal output terminal under the control of the voltage of the first control node; a feedback module enables the first voltage of the first level terminal to be equal to a voltage of a third signal output terminal under the control of the voltage of the first control node and the voltage of the first signal output terminal;

a third phase, in which the first output module outputs the first voltage of the first level terminal at the first signal output terminal under the control of the second input signal of the second signal input terminal, the voltage of the first control node, the voltage of the second control node and a voltage of a third control node; the second output module outputs the third clock signal of the third clock signal terminal at the second signal output terminal under the control of the voltage of the first control node and the voltage of the third control node; the feedback module enables the first voltage of the first level terminal to be equal to the voltage of the third signal output terminal under the control of the voltage of the first control node and the voltage of the first signal output terminal;

a fourth phase, in which a reset module enables the voltage of the first control node to be equal to the second voltage of the second level terminal under the control of the first input signal of the first signal input terminal, the second clock signal of the second clock signal terminal and a third input signal of a third signal input terminal; the first signal output terminal enables the voltage of the first signal output terminal to be equal to the second voltage of the second level terminal under the control of the second control node; the second signal output terminal enables the second voltage of the second level terminal to be equal to the voltage of the second signal output terminal under the control of the voltage of the second control node.

In some embodiments, the input module comprises a first transistor, a second transistor, a third transistor, a fourth transistor and a fifth transistor. A first terminal of the first transistor is connected with the first signal input terminal, a second terminal of the first transistor is connected with the third control node, a gate of the first transistor is connected with a gate of the second transistor. A first terminal of the second transistor is connected with the third control node, a second terminal of the second transistor is connected with the first control node, the gate of the second transistor is connected with a second terminal of the third transistor. A first terminal of the third transistor is connected with the first level terminal, the second terminal of the third transistor is connected with a first terminal of the fourth transistor, a gate of the third transistor is connected with the first clock signal terminal. The first terminal of the fourth transistor is connected with a first terminal of the fifth transistor, a second terminal of the fourth transistor is connected with a second terminal of the fifth transistor, a gate of the fourth transistor is connected with the second clock signal terminal. The second terminal of the fifth transistor is connected with the second level terminal, a gate of the fifth transistor is connected with the second signal input terminal. The third phase comprises 2n time periods, n is a positive integer. The method further comprises:

in the first phase, the first transistor is in an off state, the second transistor is in an off state, the third transistor is in an off state, the fourth transistor is in an on state, the fifth transistor is in an off state;

in the second phase, the first transistor is in an on state, the second transistor is in an on state, the third transistor is in an on state, the fourth transistor is in an off state, the fifth transistor is in an off state;

in odd time periods of the third phase, the first transistor is in an off state, the second transistor is in an off state, the third transistor is in an off state, the fourth transistor is in an on state, the fifth transistor is in an on state;

in even time periods except for the 2nth time period of the third phase, the first transistor is in an off state, the second transistor is in an off state, the third transistor is in an on state, the fourth transistor is in an off state, the fifth transistor is in an on state;

in the 2nth time period of the third phase, the first transistor is in an off state, the second transistor is in an off state, the third transistor is in an on state, the fourth transistor is in an off state, the fifth transistor is in an on state;

in the fourth phase, the first transistor is in an off state, the second transistor is in an off state, the third transistor is in an off state, the fourth transistor is in an on state, the fifth transistor is in an on state.

In some embodiments, the reset module comprises a sixth transistor, a seventh transistor, an eighth transistor, a ninth transistor and a tenth transistor. A first terminal of the sixth transistor is connected with a gate of the sixth transistor, a second terminal of the sixth transistor is connected with a first terminal of the seventh transistor, the gate of the sixth transistor is connected with the second clock signal terminal. A second terminal of the seventh transistor is connected with a first terminal of the eighth transistor, a gate of the seventh transistor is connected with a gate of the eighth transistor. The first terminal of the eighth transistor is connected with the third signal input terminal, a second terminal of the eighth transistor is connected with the second level terminal, the gate of the eighth transistor is connected with the first signal input terminal. A first terminal of the ninth transistor is connected with the first control node, a second terminal of the ninth transistor is connected with a first terminal of the tenth transistor, a gate of the ninth transistor is connected with a gate of the tenth transistor. The first terminal of the tenth transistor is connected with the third control node, a second terminal of the tenth transistor is connected with the second level terminal, the gate of the tenth transistor is connected with the second terminal of the sixth transistor. The third phase comprises 2n time periods, n is a positive integer. The method further comprises:

in the first phase, the sixth transistor is in an on state, the seventh transistor is in an on state, the eighth transistor is in an on state, the ninth transistor is in an off state, the tenth transistor is in an off state;

in the second phase, the sixth transistor is in an off state, the seventh transistor is in an on state, the eighth transistor is in an on state, the ninth transistor is in an off state, the tenth transistor is in an off state;

in odd time periods of the third phase, the sixth transistor is in an on state, the seventh transistor is in an on state, the eighth transistor is in an on state, the ninth transistor is in an off state, the tenth transistor is in an off state;

in even time periods except for the 2nth time period of the third phase, the sixth transistor is in an off state, the seventh transistor is in an on state, the eighth transistor is in an on state, the ninth transistor is in an off state, the tenth transistor is in an off state;

in the 2nth time period of the third phase, the sixth transistor is in an off state, the seventh transistor is in an off state, the eighth transistor is in an off state, the ninth transistor is in an off state, the tenth transistor is in an off state;

in the fourth phase, the sixth transistor is in an on state, the seventh transistor is in an off state, the eighth transistor is in an off state, the ninth transistor is in an on state, the tenth transistor is in an on state.

In some embodiments, the control module comprises: an eleventh transistor, a twelfth transistor, a thirteenth transistor and a fourteenth transistor. A first terminal of the eleventh transistor is connected with a gate of the eleventh transistor, a second terminal of the eleventh transistor is connected with a second terminal of the twelfth transistor, the gate of the eleventh transistor is connected with the second clock signal terminal. A first terminal of the twelfth transistor is connected with a gate of the twelfth transistor, the second terminal of the twelfth transistor is connected with a first terminal of the thirteenth transistor, the gate of the twelfth transistor is connected with the first clock signal terminal. A first terminal of the thirteenth transistor is connected with the second control node, a second terminal of the thirteenth transistor is connected with a first terminal of the fourteenth transistor, a gate of the thirteenth transistor is connected with a gate of the fourteenth transistor. The first terminal of the fourteenth transistor is connected with the third signal input terminal, a second terminal of the fourteenth transistor is connected with the second level terminal, the gate of the fourteenth transistor is connected with the first control node. The third phase comprises 2n time periods, n is a positive integer. The method further comprises:

in the first phase, the eleventh transistor is in an on state, the twelfth transistor is in an off state, the thirteenth transistor is in an off state, the fourteenth transistor is in an off state;

in the second phase, the eleventh transistor is in an off state, the twelfth transistor is in an on state, the thirteenth transistor is in an on state, the fourteenth transistor is in an on state;

in odd time periods of the third phase, the eleventh transistor is in an on state, the twelfth transistor is in an off state, the thirteenth transistor is in an on state, the fourteenth transistor is in an on state;

in even time periods except for the 2nth time period of the third phase, the eleventh transistor is in an off state, the twelfth transistor is in an on state, the thirteenth transistor is in an on state, the fourteenth transistor is in an on state;

in the 2nth time period of the third phase, the eleventh transistor is in an off state, the twelfth transistor is in an on state, the thirteenth transistor is in an on state, the fourteenth transistor is in an on state;

in the fourth phase, the eleventh transistor is in an on state, the twelfth transistor is in an off state, the thirteenth transistor is in an off state, the fourteenth transistor is in an off state.

In some embodiments, the first output module comprises a first capacitor, a second capacitor, a fifteenth transistor and a sixteenth transistor. A first electrode of the first capacitor is connected with the second signal input terminal, a second electrode of the first capacitor is connected with a first electrode of the second capacitor. The first electrode of the second capacitor is connected with the first control node, a second electrode of the second capacitor is connected with a second terminal of the fifteenth transistor. A first terminal of the fifteenth transistor is connected with the first level terminal, the second terminal of the fifteenth transistor is connected with the first signal output terminal, a gate of the fifteenth transistor is connected with the first control node. A first terminal of the sixteenth transistor is connected with the first signal output terminal, a second terminal of the sixteenth transistor is connected with the second level terminal, a gate of the sixteenth transistor is connected with the second control node. The third phase comprises 2n time periods, n is a positive integer. The method further comprises:

in the first phase, the fifteenth transistor is in an off state, the sixteenth transistor is in an on state;

in the second phase, the fifteenth transistor is in an on state, the sixteenth transistor is in an off state;

in odd time periods of the third phase, the fifteenth transistor is in an on state, the sixteenth transistor is in an off state;

in even time periods except for the 2nth time period of the third phase, the fifteenth transistor is in an on state, the sixteenth transistor is in an off state;

in the 2nth time period of the third phase, the fifteenth transistor is in an on state, the sixteenth transistor is in an off state;

in the fourth phase, the fifteenth transistor is in an off state, the sixteenth transistor is in an on state.

In some embodiments, the second output module comprises a seventeenth transistor and an eighteenth transistor. A first terminal of the seventeenth transistor is connected with the third clock signal terminal; a second terminal of the seventeenth transistor is connected with the second signal output terminal, a gate of the seventeenth transistor is connected with the first control node. A first terminal of the eighteenth transistor is connected with the second signal output terminal, a second terminal of the eighteenth transistor is connected with the second level terminal, a gate of the eighteenth transistor is connected with the second control node. The third phase comprises 2n time periods, n is a positive integer. The method further comprises:

in the first phase, the seventeenth transistor is in an off state, the eighteenth transistor is in an on state;

in the second phase, the seventeenth transistor is in an on state, the eighteenth transistor is in an off state;

in odd time periods of the third phase, the seventeenth transistor is in an on state, the eighteenth transistor is in an off state;

in even time periods except for the 2nth time period of the third phase, the seventeenth transistor is in an on state, the eighteenth transistor is in an off state;

in the 2nth time period of the third phase, the seventeenth transistor is in an on state, the eighteenth transistor is in an off state;

in the fourth phase, the seventeenth transistor is in an off state, the eighteenth transistor is in an on state.

In some embodiments, the feedback module comprises a nineteenth transistor, a twentieth transistor, a twenty-first transistor and a twenty-second transistor. A first terminal of the nineteenth transistor is connected with the first level terminal, a second terminal of the nineteenth transistor is connected with a first terminal of the twentieth transistor, a gate of the nineteenth transistor is connected with the first control node. The first terminal of the twentieth transistor is connected with a first terminal of the twenty-first transistor, a second terminal of the twentieth transistor is connected with the second level terminal, a gate of the twentieth transistor is connected with the second control node. The first terminal of the twenty-first transistor is connected with a first terminal of the twenty-second transistor, a second terminal of the twenty-first transistor is connected with the third control node, a gate of the twenty-first transistor is connected with a gate of the twenty-second transistor. A second terminal of the twenty-second transistor is connected with the third signal output terminal, the gate of the twenty-second transistor is connected with the first signal output terminal. The third phase comprises 2n time periods, n is a positive integer. The method further comprises:

in the first phase, the nineteenth transistor is in an off state, the twentieth transistor is in an on state, the twenty-first transistor is in an off state, the twenty-second transistor is in an off state;

in the second phase, the nineteenth transistor is in an on state, the twentieth transistor is in an off state, the twenty-first transistor is in an on state, the twenty-second transistor is in an on state;

in odd time periods of the third phase, the nineteenth transistor is in an on state, the twentieth transistor is in an off state, the twenty-first transistor is in an on state, the twenty-second transistor is in an on state;

in even time periods except for the 2nth time period of the third phase, the nineteenth transistor is in an on state, the twentieth transistor is in an off state, the twenty-first transistor is in an on state, the twenty-second transistor is in an on state;

in the 2nth time period of the third phase, the nineteenth transistor is in an on state, the twentieth transistor is in an off state, the twenty-first transistor is in an on state, the twenty-second transistor is in an on state;

in the fourth phase, the nineteenth transistor is in an off state, the twentieth transistor is in an on state, the twenty-first transistor is in an off state, the twenty-second transistor is in an off state.

In some embodiments, the transistors are all N-type transistors; or the transistors are all P-type transistors.

In some embodiments, the first clock signal of the first clock signal terminal and the second clock signal of the second clock signal terminal have opposite phases, and the first clock signal of the first clock signal terminal and the second clock signal of the second clock signal terminal both have a duty ratio of 50%.

The GOA unit and the driving method, the GOA circuit and the display device provided by embodiments of the disclosure control and output a drive signal to the gate line through the input module, the reset module, the control module, the first output module, the second output module and the feedback module. Compared with the prior art in which the drive signal of one stage gate line is controlled and outputted by two GOA units of the same or similar structure, the drive signal of one stage gate line in embodiments of the disclosure is controlled and outputted by one GOA unit. So, with embodiments of the disclosure, the area of the gate driving circuit may be reduced, and the power consumption of the gate driving circuit may be decreased.

BRIEF DESCRIPTION OF THE DRAWINGS

In order to explain the embodiments of the disclosure or the technical solution in the prior art more clearly, the drawings to be used in the description of the embodiments or the prior art will be introduced briefly next. Apparently, the drawings described below are only some embodiments of the disclosure. For the skilled person in the art, other drawings can also be obtained based on these drawings without paying any inventive effort.

FIG. 4 is a schematic flow chart of a driving method of a GOA unit provided by an embodiment of the disclosure.

DETAILED DESCRIPTION

Figure 1:
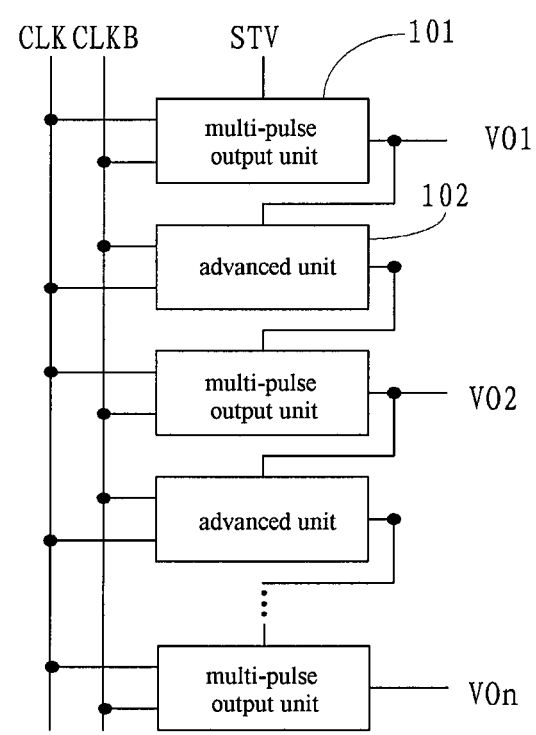
FIG. 1 is a schematic structural view of a multi-pulse shift register in the prior art.

Next, the technical solutions in the embodiments of the disclosure will be described clearly and completely with reference to the drawings in the embodiments of the disclosure. Apparently, the embodiments described are only a part of rather than all of the embodiments of the disclosure. Based on the embodiments of the disclosure, all other embodiments obtained by the ordinary skilled person in the art without paying any inventive effort belong to the protection scope of the disclosure.

The transistors used in all embodiments of the disclosure can be thin film transistors or field effect transistors or other devices with the same properties. According to the function in the circuit, the transistors used in the embodiments of the disclosure can be switch transistors mainly. Because the source and the drain of the switch transistor used here are symmetrical, the source and the drain thereof are interchangeable. In embodiments of the disclosure, in order to distinguish the two terminals of the transistor except for the gate, the source thereof is called a first terminal, and the drain is called a second terminal. It is prescribed according to the forms in the drawings that the middle terminal of the transistor is the gate, the signal input terminal is the source, and the signal output terminal is the drain. In addition, the switch transistors used in embodiments of the disclosure include P-type switch transistors and N-type switch transistors. The P-type switch transistor is turned on when the gate is of a low level and is turned off when the gate is of a high level. The N-type switch transistor is turned on when the gate is of a high level and is turned off when the gate is of a low level. The driving transistors include P-type driving transistors and N-type driving transistors. The P-type driving transistor is in an amplification state or a saturation state when the gate voltage is of a low level (the gate voltage is less than the source voltage) and the absolute value of the voltage difference between the gate and the source is greater than a threshold voltage. The N-type driving transistor is in an amplification state or a saturation state when the gate voltage is of a high level (the gate voltage is greater than the source voltage) and the absolute value of the voltage difference between the gate and the source is greater than a threshold voltage.

Figure 2:
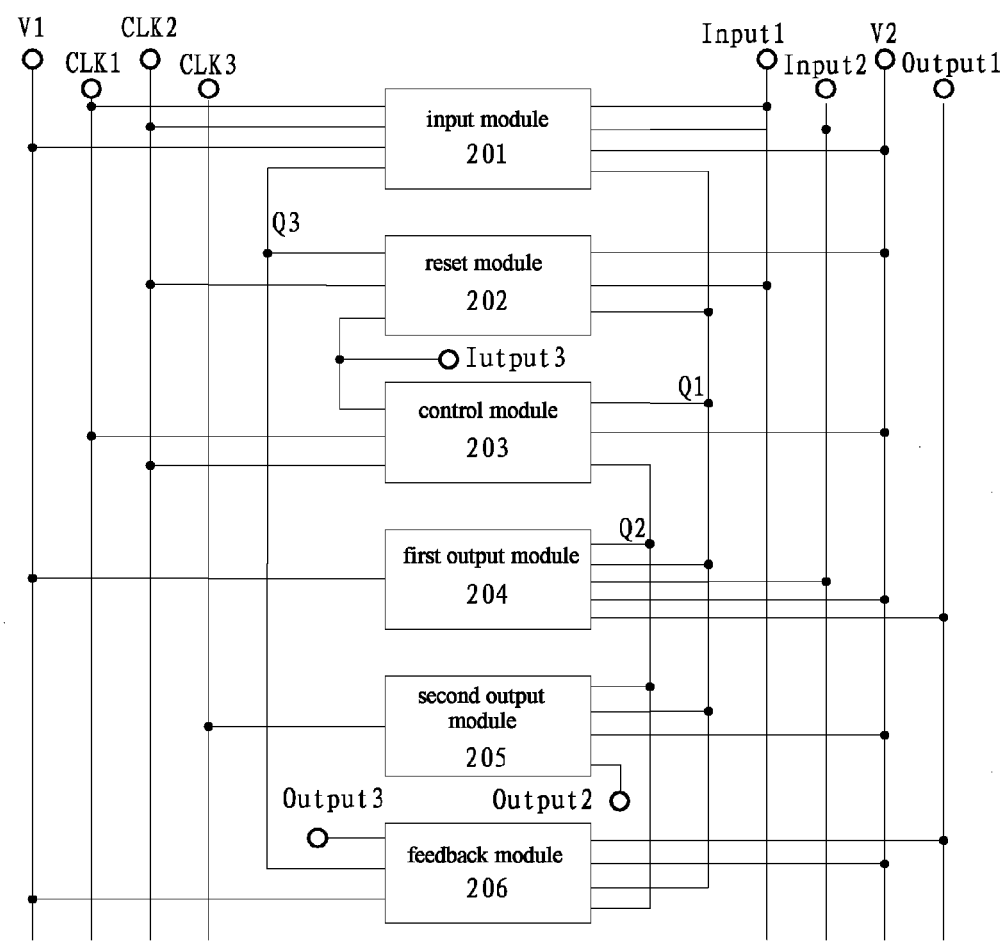
FIG. 2 is a schematic structural view of a GOA unit provided by an embodiment of the disclosure.

As shown in FIG. 2, an embodiment of the disclosure provides a GOA unit. The GOA unit comprises an input module 201, a reset module 202, a control module 203, a first output module 204, a second output module 205 and a feedback module 206.

The input module 201 is connected with a first signal input terminal Input1, a second signal input terminal Input2, a first clock signal terminal CLK1, a second clock signal terminal CLK2, a first level terminal V1, a second level terminal V2, a first control node Q1 and a third control node Q3, for enabling a voltage of the first signal input terminal Input1 to be equal to a voltage of the first control node Q1 (i.e., enabling the potentials of the two voltages to be equal) under the control of a second input signal of the second signal input terminal Input2, a first clock signal of the first clock signal terminal CLK1, a second clock signal of the second clock signal terminal CLK2, a first voltage of the first level terminal V1, a second voltage of the second level terminal V2 and a voltage of the third control node Q3.

The reset module 202 is connected with the first signal input terminal Input1, the second clock signal terminal CLK2, the second level terminal V2, the first control node Q1, the third control node Q3 and a third signal input terminal Input3, for enabling a voltage of the first control node Q1 to be equal to the second voltage of the second level terminal V2 under the control of a first input signal of the first signal input terminal Input1, the second clock signal of the second clock signal terminal CLK2 and a third input signal of the third signal input terminal Input3.

The control module 203 is connected with the first clock signal terminal CLK1, the second clock signal terminal CLK2, the first control node Q1, the second level terminal V2, a second control node Q2 and the third signal input terminal Input3, for enabling a voltage of the second control node Q2 to be equal to a voltage of the first clock signal terminal CLK1 under the control of the first clock signal of the first clock signal terminal CLK1, the voltage of the first control node Q1 and the third input signal of the third signal input terminal Input3, or enabling the voltage of the second control node Q2 to be equal to the voltage of the first clock signal terminal CLK1 under the control of the second clock signal of the second clock signal terminal CLK2, the voltage of the first control node Q1 and the third input signal of the third signal input terminal Input3, or enabling the voltage of the second control node Q2 to be equal to the second voltage of the second level terminal V2 under the control of the voltage of the first control node Q1.

The first output module 204 is connected with the second signal input terminal Input2, the first control node Q1, the second control node Q2, the first level terminal V1, the second level terminal V2 and a first signal output terminal Output1, for outputting the first voltage of the first level terminal V1 at the first signal output terminal Output1 under the control of the second input signal of the second signal input terminal Input2, the voltage of the first control node Q1 and the voltage of the second control node Q2, or enabling a voltage of the first signal output terminal Output1 to be equal to the second voltage of the second level terminal V2 under the control of the second control node Q2.

The second output module 205 is connected to the first control node Q1, the second control node Q2, the second level terminal V2, a third clock signal terminal CLK3 and a second signal output terminal Output2, for outputting a third clock signal of the third clock signal terminal CLK3 at the second signal output terminal Output2 under the control of the voltage of the first control node Q1, or enabling the second voltage of the second level terminal V2 to be equal to a voltage of the second signal output terminal Output2 under the control of the voltage of the second control node Q2.

The feedback module 206 is connected with the first signal output terminal Output1, the first control node Q1, the second control node Q2, the first level terminal V1, the second level terminal V2, a third signal output terminal Output3 and the third control node Q3, for enabling a voltage of the third control node Q3 to be equal to the first voltage of the first level terminal V1 and outputting the first voltage of the first level terminal V1 at the third signal output terminal Output3 under the control of the voltage of the first control node Q1, the voltage of the second control node Q2 and the voltage of the first signal output terminal Output1.

The GOA unit provided by the embodiment of the disclosure controls and outputs a drive signal to the gate line through the input module, the reset module, the control module, the first output module, the second output module and the feedback module. Compared with the prior art in which the drive signal of one stage gate line is controlled and outputted by two GOA units of the same or similar structure, the drive signal of one stage gate line in the embodiment of the disclosure is controlled and outputted by one GOA unit. So, with the embodiment of the disclosure, the area of the gate driving circuit may be reduced, and the power consumption of the gate driving circuit may be decreased.

Figure 3:
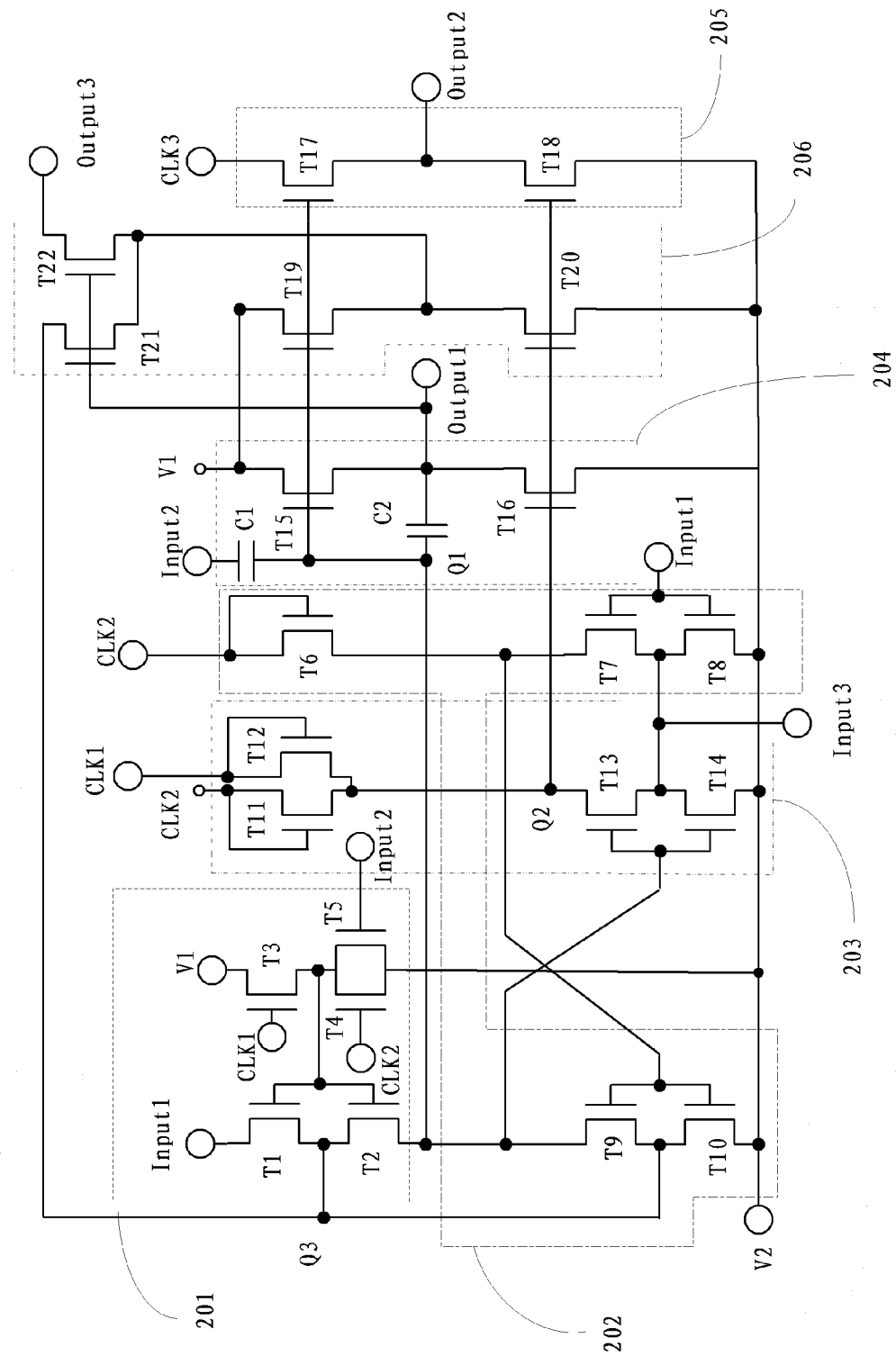
FIG. 3 is a structural view of a GOA circuit provided by an embodiment of the disclosure.

Specifically, as shown in FIG. 3, the input module comprises a first transistor T1, a second transistor T2, a third transistor T3, a fourth transistor T4 and a fifth transistor T5.

A first terminal of the first transistor T1 is connected with the first signal input terminal Input1. A second terminal of the first transistor T1 is connected with the third control node Q3. A gate of the first transistor T1 is connected with a gate of the second transistor T2.

A first terminal of the second transistor T2 is connected with the third control node Q3. A second terminal of the second transistor T2 is connected with the first control node Q1. The gate of the second transistor T2 is connected with a second terminal of the third transistor T3.

A first terminal of the third transistor T3 is connected with the first level terminal V1. The second terminal of the third transistor T3 is connected with a first terminal of the fourth transistor T4. A gate of the third transistor T3 is connected with the first clock signal terminal CLK1.

The first terminal of the fourth transistor T4 is connected with a first terminal of the fifth transistor T5. A second terminal of the fourth transistor T4 is connected with a second terminal of the fifth transistor T5. A gate of the fourth transistor T4 is connected with the second clock signal terminal CLK2.

The second terminal of the fifth transistor T5 is connected with the second level terminal V2. A gate of the fifth transistor T5 is connected with the second signal input terminal Input2.

The reset module 202 comprises a sixth transistor T6, a seventh transistor T7, an eighth transistor T8, a ninth transistor T9 and a tenth transistor T10.

A first terminal of the sixth transistor T6 is connected with a gate of the sixth transistor T6. A second terminal of the sixth transistor T6 is connected with a first terminal of the seventh transistor T7. The gate of the sixth transistor T6 is connected with the second clock signal terminal CLK2.

A second terminal of the seventh transistor T7 is connected with a first terminal of the eighth transistor T8. A gate of the seventh transistor T7 is connected with a gate of the eighth transistor T8.

The first terminal of the eighth transistor T8 is connected with the third signal input terminal Input3. A second terminal of the eighth transistor T8 is connected with the second level terminal V2. The gate of the eighth transistor T8 is connected with the first signal input terminal Input1.

A first terminal of the ninth transistor T9 is connected with the first control node Q1. A second terminal of the ninth transistor T9 is connected with a first terminal of the tenth transistor T10. A gate of the ninth transistor T9 is connected with a gate of the tenth transistor T10.

The first terminal of the tenth transistor T10 is connected with the third control node Q3. A second terminal of the tenth transistor T10 is connected with the second level terminal V2. The gate of the tenth transistor T10 is connected with the second terminal of the sixth transistor T6.

The control module 203 comprises an eleventh transistor T11, a twelfth transistor T12, a thirteenth transistor T13 and a fourteenth transistor T14.

A first terminal of the eleventh transistor T11 is connected with a gate of the eleventh transistor T11. A second terminal of the eleventh transistor T11 is connected with a second terminal of the twelfth transistor T12. The gate of the eleventh transistor T11 is connected with the second clock signal terminal CLK2.

A first terminal of the twelfth transistor T12 is connected with a gate of the twelfth transistor T12. The second terminal of the twelfth transistor T12 is connected with a first terminal of the thirteenth transistor T13. The gate of the twelfth transistor T12 is connected with the first clock signal terminal CLK1.

A first terminal of the thirteenth transistor T13 is connected with the second control node Q2. A second terminal of the thirteenth transistor T13 is connected with a first terminal of the fourteenth transistor T14. A gate of the thirteenth transistor T13 is connected with a gate of the fourteenth transistor T14.

The first terminal of the fourteenth transistor T14 is connected with the third signal input terminal Input3. A second terminal of the fourteenth transistor T14 is connected with the second level terminal V2. The gate of the fourteenth transistor T14 is connected with the first control node Q1.

The first output module 204 comprises a first capacitor C1, a second capacitor C2, a fifteenth transistor T15 and a sixteenth transistor T16.

A first electrode of the first capacitor C1 is connected with the second signal input terminal Input2. A second electrode of the first capacitor C1 is connected with a first electrode of the second capacitor C2.

The first electrode of the second capacitor C2 is connected with the first control node Q1. A second electrode of the second capacitor C2 is connected with a second terminal of the fifteenth transistor T15.

A first terminal of the fifteenth transistor T15 is connected with the first level terminal V1. The second terminal of the fifteenth transistor T15 is connected with the first signal output terminal Output1. A gate of the fifteenth transistor T15 is connected with the first control node Q1.

A first terminal of the sixteenth transistor T16 is connected with the first signal output terminal Output1. A second terminal of the sixteenth transistor T16 is connected with the second level terminal V2. A gate of the sixteenth transistor T16 is connected with the second control node Q2.

The second output module 205 comprises a seventeenth transistor T17 and an eighteenth transistor T18.

A first terminal of the seventeenth transistor T17 is connected with the third clock signal terminal CLK3. A second terminal of the seventeenth transistor T17 is connected with the second signal output terminal Output2. A gate of the seventeenth transistor T17 is connected with the first control node Q1.

A first terminal of the eighteenth transistor T18 is connected with the second signal output terminal Output2. A second terminal of the eighteenth transistor T18 is connected with the second level terminal V2. A gate of the eighteenth transistor T18 is connected with the second control node Q2.

The feedback module 206 comprises a nineteenth transistor T19, a twentieth transistor T20, a twenty-first transistor T21 and a twenty-second transistor T22.

A first terminal of the nineteenth transistor T19 is connected with the first level terminal V1. A second terminal of the nineteenth transistor T19 is connected with a first terminal of the twentieth transistor T20. A gate of the nineteenth transistor T19 is connected with the first control node Q1.

The first terminal of the twentieth transistor T20 is connected with a first terminal of the twenty-first transistor T21. A second terminal of the twentieth transistor T20 is connected with the second level terminal V2. A gate of the twentieth transistor T20 is connected with the second control node Q2.

The first terminal of the twenty-first transistor T21 is connected with a first terminal of the twenty-second transistor T22. A second terminal of the twenty-first transistor T21 is connected with the third control node Q3. A gate of the twenty-first transistor T21 is connected with a gate of the twenty-second transistor T22.

A second terminal of the twenty-second transistor T22 is connected with the third signal output terminal Output3. The gate of the twenty-second transistor T22 is connected with the first signal output terminal Output1.

It should be noted that in the above embodiments, several modules may share one signal terminal (for example, the input module, the reset module, the control module, the first output module, the second output module and the feedback module may share the second level terminal), which can reduce the number of the signal terminals in the GOA unit.

Certainly, these modules can also be connected with different signal terminals respectively, as long as the signal terminals can provide similar signals.

An embodiment of the disclosure provides a method for driving a GOA unit, as shown in FIG. 4, the method comprising:

S401, a first phase, in which a control module enables a voltage of a second control node to be equal to a voltage of a first clock signal terminal under the control of a first clock signal of the first clock signal terminal and a voltage of a first control node; a first output module enables a second voltage of a second level terminal to be equal to a voltage of a first signal output terminal under the control of the voltage of the second control node; a second output terminal enables the second voltage of the second level terminal to be equal to a voltage of a second signal output terminal under the control of the voltage of the second control node.

S402, a second phase, in which an input module enables a voltage of a first signal input terminal to be equal to the voltage of the first control node under the control of a second input signal of a second signal input terminal, the first clock signal of the first clock signal terminal, a second clock signal of a second clock signal terminal, a first voltage of a first level terminal and the second voltage of the second level terminal; the first output module outputs the first voltage of the first level terminal at the first signal output terminal under the control of the second input signal of the second signal input terminal, the voltage of the first control node and the voltage of the second control node; the second output module outputs a third clock signal of a third clock signal terminal at the second signal output terminal under the control of the voltage of the first control node; a feedback module enables the first voltage of the first level terminal to be equal to a voltage of a third signal output terminal under the control of the voltage of the first control node and the voltage of the first signal output terminal.

S403, a third phase, in which the first output module outputs the first voltage of the first level terminal at the first signal output terminal under the control of the second input signal of the second signal input terminal, the voltage of the first control node, the voltage of the second control node and a voltage of a third control node; the second output module outputs the third clock signal of the third clock signal terminal at the second signal output terminal under the control of the voltage of the first control node and the voltage of the third control node; the feedback module enables the first voltage of the first level terminal to be equal to the voltage of the third signal output terminal under the control of the voltage of the first control node and the voltage of the first signal output terminal.

S404, a fourth phase, in which a reset module enables the voltage of the first control node to be equal to the second voltage of the second level terminal under the control of the first input signal of the first signal input terminal, the second clock signal of the second clock signal terminal and a third input signal of a third signal input terminal; the first signal output terminal enables the voltage of the first signal output terminal to be equal to the second voltage of the second level terminal under the control of the second control node; the second signal output terminal enables the second voltage of the second level terminal to be equal to the voltage of the second signal output terminal under the control of the voltage of the second control node.

For the above method for driving a GOA unit, in the first phase, the control module enables the voltage of the second control node to be equal to the voltage of the first clock signal terminal. The first output module enables the second voltage of the second level terminal to be equal to the voltage of the first signal output terminal. The second output module enables the second voltage of the second level terminal to be equal to the voltage of the second signal output terminal. In the second phase, the input module enables the voltage of the first signal input terminal to be equal to the voltage of the first control node. The first output module outputs the first voltage of the first level terminal at the first signal output terminal. The second output module outputs the first voltage of the first level terminal at the third signal output terminal. In the third phase, the first output terminal outputs the first voltage of the first level terminal at the first signal output terminal. The second output module outputs the third clock signal of the third clock signal terminal at the second signal output terminal. The feedback module outputs the first voltage of the first level terminal at the third signal output terminal. In the fourth phase, the reset module enables the voltage of the first control node to be equal to the second voltage of the second level terminal. The first signal output terminal enables the voltage of the first signal output terminal to be equal to the second voltage of the second level terminal. The second signal output terminal enables the second voltage of the second level terminal to be equal to the voltage of the second signal output terminal. Therefore, the above method for driving the GOA unit controls and outputs a drive signal to the gate line through the input module, the reset module, the control module, the first output module, the second output module and the feedback module. Compared with the prior art in which the drive signal of one stage gate line is controlled and outputted by two GOA units of the same or similar structure, the drive signal of one stage gate line in embodiments of the disclosure is controlled and outputted by one GOA unit. So, with the embodiments of the disclosure, the area of the gate driving circuit may be reduced, and the power consumption of the gate driving circuit may be decreased.

In some embodiments, the input module comprises a first transistor, a second transistor, a third transistor, a fourth transistor and a fifth transistor.

A first terminal of the first transistor is connected with the first signal input terminal. A second terminal of the first transistor is connected with the third control node. A gate of the first transistor is connected with a gate of the second transistor.

A first terminal of the second transistor is connected with the third control node. A second terminal of the second transistor is connected with the first control node. The gate of the second transistor is connected with a second terminal of the third transistor.

A first terminal of the third transistor is connected with the first level terminal. The second terminal of the third transistor is connected with a first terminal of the fourth transistor. A gate of the third transistor is connected with the first clock signal terminal.

The first terminal of the fourth transistor is connected with a first terminal of the fifth transistor. A second terminal of the fourth transistor is connected with a second terminal of the fifth transistor. A gate of the fourth transistor is connected with the second clock signal terminal.

The second terminal of the fifth transistor is connected with the second level terminal. A gate of the fifth transistor is connected with the second signal input terminal.

The third phase comprises 2n time periods, wherein n is a positive integer. The method further comprises:

in the first phase, the first transistor is in an off state, the second transistor is in an off state, the third transistor is in an off state, the fourth transistor is in an on state, the fifth transistor is in an off state;

in the second phase, the first transistor is in an on state, the second transistor is in an on state, the third transistor is in an on state, the fourth transistor is in an off state, the fifth transistor is in an off state;

in odd time periods of the third phase, the first transistor is in an off state, the second transistor is in an off state, the third transistor is in an off state, the fourth transistor is in an on state, the fifth transistor is in an on state;

in even time periods except for the 2nth time period of the third phase, the first transistor is in an off state, the second transistor is in an off state, the third transistor is in an on state, the fourth transistor is in an off state, the fifth transistor is in an on state;

in the 2nth time period of the third phase, the first transistor is in an off state, the second transistor is in an off state, the third transistor is in an on state, the fourth transistor is in an off state, the fifth transistor is in an on state;

in the fourth phase, the first transistor is in an off state, the second transistor is in an off state, the third transistor is in an off state, the fourth transistor is in an on state, the fifth transistor is in an on state.

In some embodiments, the reset module comprises a sixth transistor, a seventh transistor, an eighth transistor, a ninth transistor and a tenth transistor.

A first terminal of the sixth transistor is connected with a gate of the sixth transistor. A second terminal of the sixth transistor is connected with a first terminal of the seventh transistor. The gate of the sixth transistor is connected with the second clock signal terminal.

A second terminal of the seventh transistor is connected with a first terminal of the eighth transistor. A gate of the seventh transistor is connected with a gate of the eighth transistor.

The first terminal of the eighth transistor is connected with the third signal input terminal. A second terminal of the eighth transistor is connected with the second level terminal. The gate of the eighth transistor is connected with the first signal input terminal.

A first terminal of the ninth transistor is connected with the first control node. A second terminal of the ninth transistor is connected with a first terminal of the tenth transistor. A gate of the ninth transistor is connected with a gate of the tenth transistor.

The first terminal of the tenth transistor is connected with the third control node. A second terminal of the tenth transistor is connected with the second level terminal. The gate of the tenth transistor is connected with the second terminal of the sixth transistor.

The third phase comprises 2n time periods, wherein n is a positive integer. The method further comprises:

in the first phase, the sixth transistor is in an on state, the seventh transistor is in an on state, the eighth transistor is in an on state, the ninth transistor is in an off state, the tenth transistor is in an off state;

in the second phase, the sixth transistor is in an off state, the seventh transistor is in an on state, the eighth transistor is in an on state, the ninth transistor is in an off state, the tenth transistor is in an off state;

in odd time periods of the third phase, the sixth transistor is in an on state, the seventh transistor is in an on state, the eighth transistor is in an on state, the ninth transistor is in an off state, the tenth transistor is in an off state;

in even time periods except for the 2nth time period of the third phase, the sixth transistor is in an off state, the seventh transistor is in an on state, the eighth transistor is in an on state, the ninth transistor is in an off state, the tenth transistor is in an off state;

in the 2nth time period of the third phase, the sixth transistor is in an off state, the seventh transistor is in an off state, the eighth transistor is in an off state, the ninth transistor is in an off state, the tenth transistor is in an off state;

in the fourth phase, the sixth transistor is in an on state, the seventh transistor is in an off state, the eighth transistor is in an off state, the ninth transistor is in an on state, the tenth transistor is in an on state.

In some embodiments, the control module comprises an eleventh transistor, a twelfth transistor, a thirteenth transistor and a fourteenth transistor.

A first terminal of the eleventh transistor is connected with a gate of the eleventh transistor. A second terminal of the eleventh transistor is connected with a second terminal of the twelfth transistor. The gate of the eleventh transistor is connected with the second clock signal terminal.

A first terminal of the twelfth transistor is connected with a gate of the twelfth transistor. The second terminal of the twelfth transistor is connected with a first terminal of the thirteenth transistor. The gate of the twelfth transistor is connected with the first clock signal terminal.

A first terminal of the thirteenth transistor is connected with the second control node. A second terminal of the thirteenth transistor is connected with a first terminal of the fourteenth transistor. A gate of the thirteenth transistor is connected with a gate of the fourteenth transistor.

The first terminal of the fourteenth transistor is connected with the third signal input terminal. A second terminal of the fourteenth transistor is connected with the second level terminal. The gate of the fourteenth transistor is connected with the first control node.

The third phase comprises 2n time periods, wherein n is a positive integer. The method further comprises:

in the first phase, the eleventh transistor is in an on state, the twelfth transistor is in an off state, the thirteenth transistor is in an off state, the fourteenth transistor is in an off state;

in the second phase, the eleventh transistor is in an off state, the twelfth transistor is in an on state, the thirteenth transistor is in an on state, the fourteenth transistor is in an on state;

in odd time periods of the third phase, the eleventh transistor is in an on state, the twelfth transistor is in an off state, the thirteenth transistor is in an on state, the fourteenth transistor is in an on state;

in even time periods except for the 2nth time period of the third phase, the eleventh transistor is in an off state, the twelfth transistor is in an on state, the thirteenth transistor is in an on state, the fourteenth transistor is in an on state;

in the 2nth time period of the third phase, the eleventh transistor is in an off state, the twelfth transistor is in an on state, the thirteenth transistor is in an on state, the fourteenth transistor is in an on state;

in the fourth phase, the eleventh transistor is in an on state, the twelfth transistor is in an off state, the thirteenth transistor is in an off state, the fourteenth transistor is in an off state.

In some embodiments, the first output module comprises a first capacitor, a second capacitor, a fifteenth transistor and a sixteenth transistor.

A first electrode of the first capacitor is connected with the second signal input terminal. A second electrode of the first capacitor is connected with a first electrode of the second capacitor.

The first electrode of the second capacitor is connected with the first control node. A second electrode of the second capacitor is connected with a second terminal of the fifteenth transistor.

A first terminal of the fifteenth transistor is connected with the first level terminal. The second terminal of the fifteenth transistor is connected with the first signal output terminal. A gate of the fifteenth transistor is connected with the first control node.

A first terminal of the sixteenth transistor is connected with the first signal output terminal. A second terminal of the sixteenth transistor is connected with the second level terminal. A gate of the sixteenth transistor is connected with the second control node.

The third phase comprises 2n time periods, wherein n is a positive integer. The method further comprises:

in the first phase, the fifteenth transistor is in an off state, the sixteenth transistor is in an on state;

in the second phase, the fifteenth transistor is in an on state, the sixteenth transistor is in an off state;

in odd time periods of the third phase, the fifteenth transistor is in an on state, the sixteenth transistor is in an off state;

in even time periods except for the 2nth time period of the third phase, the fifteenth transistor is in an on state, the sixteenth transistor is in an off state;

in the 2nth time period of the third phase, the fifteenth transistor is in an on state, the sixteenth transistor is in an off state;

in the fourth phase, the fifteenth transistor is in an off state, the sixteenth transistor is in an on state.

In some embodiments, the second output module comprises a seventeenth transistor and an eighteenth transistor.

A first terminal of the seventeenth transistor is connected with the third clock signal terminal. A second terminal of the seventeenth transistor is connected with the second signal output terminal. A gate of the seventeenth transistor is connected with the first control node.

A first terminal of the eighteenth transistor is connected with the second signal output terminal. A second terminal of the eighteenth transistor is connected with the second level terminal. A gate of the eighteenth transistor is connected with the second control node.

The third phase comprises 2n time periods, wherein n is a positive integer. The method further comprises:

in the first phase, the seventeenth transistor is in an off state, the eighteenth transistor is in an on state;

in the second phase, the seventeenth transistor is in an on state, the eighteenth transistor is in an off state;

in odd time periods of the third phase, the seventeenth transistor is in an on state, the eighteenth transistor is in an off state;

in even time periods except for the 2nth time period of the third phase, the seventeenth transistor is in an on state, the eighteenth transistor is in an off state;

in the 2nth time period of the third phase, the seventeenth transistor is in an on state, the eighteenth transistor is in an off state;

in the fourth phase, the seventeenth transistor is in an off state, the eighteenth transistor is in an on state.

In some embodiments, the feedback module comprises a nineteenth transistor, a twentieth transistor, a twenty-first transistor and a twenty-second transistor.

A first terminal of the nineteenth transistor is connected with the first level terminal. A second terminal of the nineteenth transistor is connected with a first terminal of the twentieth transistor. A gate of the nineteenth transistor is connected with the first control node.

The first terminal of the twentieth transistor is connected with a first terminal of the twenty-first transistor. A second terminal of the twentieth transistor is connected with the second level terminal. A gate of the twentieth transistor is connected with the second control node.

The first terminal of the twenty-first transistor is connected with a first terminal of the twenty-second transistor. A second terminal of the twenty-first transistor is connected with the third control node. A gate of the twenty-first transistor is connected with a gate of the twenty-second transistor.

A second terminal of the twenty-second transistor is connected with the third signal output terminal. The gate of the twenty-second transistor is connected with the first signal output terminal.

The third phase comprises 2n time periods, wherein n is a positive integer. The method further comprises:

in the first phase, the nineteenth transistor is in an off state, the twentieth transistor is in an on state, the twenty-first transistor is in an off state, the twenty-second transistor is in an off state;

in the second phase, the nineteenth transistor is in an on state, the twentieth transistor is in an off state, the twenty-first transistor is in an on state, the twenty-second transistor is in an on state;

in odd time periods of the third phase, the nineteenth transistor is in an on state, the twentieth transistor is in an off state, the twenty-first transistor is in an on state, the twenty-second transistor is in an on state;

in even time periods except for the 2nth time period of the third phase, the nineteenth transistor is in an on state, the twentieth transistor is in an off state, the twenty-first transistor is in an on state, the twenty-second transistor is in an on state;

in the 2nth time period of the third phase, the nineteenth transistor is in an on state, the twentieth transistor is in an off state, the twenty-first transistor is in an on state, the twenty-second transistor is in an on state;

in the fourth phase, the nineteenth transistor is in an off state, the twentieth transistor is in an on state, the twenty-first transistor is in an off state, the twenty-second transistor is in an off state.

In some embodiments, the transistors are all N-type transistors; or the transistors are all P-type transistors.

In some embodiments, the first clock signal of the first clock signal terminal and the second clock signal of the second clock signal terminal have opposite phases, and the first clock signal of the first clock signal terminal and the second clock signal of the second clock signal terminal both have a duty ratio of 50%.

Figure 5:
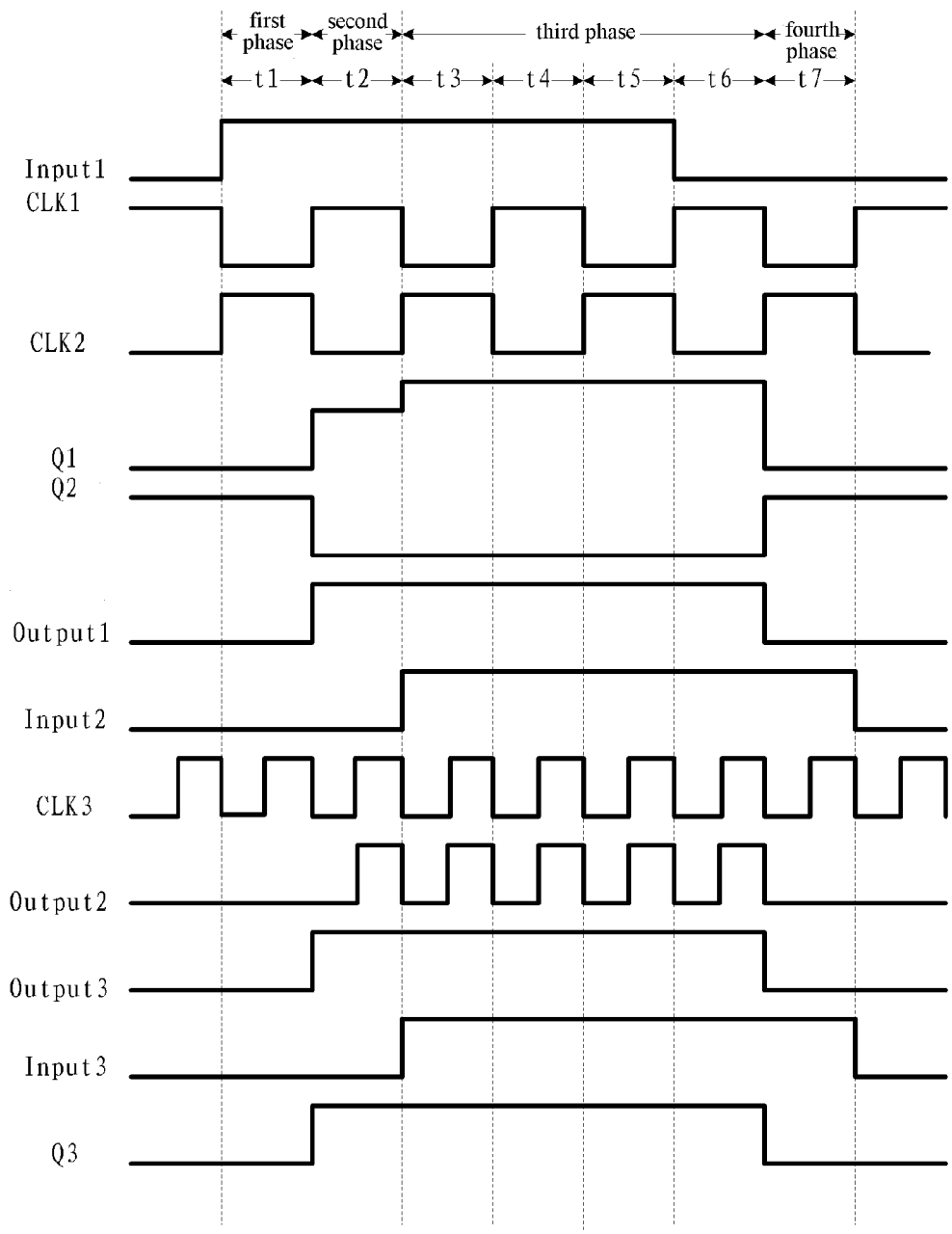
FIG. 5 is a schematic view of a signal timing state of a GOA unit provided by an embodiment of the disclosure.

The working principles of the GOA unit of FIG. 3 and the corresponding method for driving a GOA unit of FIG. 4 will be explained in the following with reference to the timing state schematic view as shown in FIG. 5. All transistors therein are for example N-type transistors that are turned on with a high level. FIG. 5 shows timing states of the first clock signal of the first clock signal terminal CLK1, the second clock signal of the second clock signal terminal CLK2, the third clock signal of the third clock signal terminal CLK3, the first input signal of the first signal input terminal Input1, the second input signal of the second signal input terminal Input2, the third input signal of the third signal input terminal Input3, the first output signal of the first signal output terminal Output1, the second output signal of the second signal output terminal Output2, the third output signal of the third signal output terminal Output3, the voltage of the first control node Q1, the voltage of the second control node Q2 and the voltage of the third control node Q3. The first level terminal V1 and the second level terminal V2 provide stable voltages. Exemplarily, the first voltage of the first level terminal V1 is of a high level. The second voltage of the second level terminal V2 is of a low level. The second level terminal V2 can also provide a ground voltage. In addition, if the GOA unit is a first stage GOA unit, the timing state of the Input1 is same as the timing state of the frame start signal. As shown in FIG. 5, the timing states during four phases are provided, the first phase includes t1; the second phase includes t2; the third phase includes t3, t4, t5, t6; the fourth phase includes t7.

In the phase of t1, Input1, CLK2 and Q2 are of high levels. CLK1, Q1, Output1, Input2, Output3, Input3 and Q3 are of low levels. T4, T6, T7, T8, T11, T16, T18, T20 are turned on. T1, T2, T3, T5, T9, T10, T12, T13, T14, T15, T17, T19, T21, T22 are turned off. In this phase, CLK2 is of a high level, so T4 is turned on. The gates of T1 and T2 are connected with V2 through T4, so T1, T2 are turned off. CLK2 is of a high level, so T6 is turned on. T13, T14 are turned off, so Q2 is of a high level. T16, T18, T20 are turned on. Output2 is connected with V2 through T18, so Output2 is of a low level.

In the phase of t2, Input1, CLK1, Q1, Output1, Output3 and Q3 are of high levels. CLK2, Q2, Input2 and Input3 are of low levels. T1, T2, T3, T7, T8, T12, T13, T14, T15, T17, T19, T21, T22 are turned on. T4, T5, T6, T9, T10, T11, T16, T18, T20 are turned off. In this phase, CLK2 is of a low level, so T4 is turned off. Input2 is of a low level, so T5 is turned off. CLK1 is of a high level, so T3 is turned on. The gates of T1 and T2 are connected with V1 through T3, so T1 and T2 are turned on. Q1 is connected with Input1 through T1 and T2, so Q1 is of a high level, T15, T17, T19 are turned on. Output1 is connected with V1 through T15, so Output1 outputs a high level. Since T17 is turned on, Output2 is connected with CLK3 through T17, Output2 outputs the clock signal of CLK3. Output3 is connected with V1 through T22, T19, so Output3 outputs a high level. Q3 is connected with V1 through T21, T19, so Q3 is of a high level. The high level of Q3 can prevent electric leakage when T1, T2, T9, T10 are turned off, thereby being capable of enabling Q1 to remain at a high level.

In the phase of t3, Input1, CLK2, Q1, Output1, Input2, Output3, Input3 and Q3 are of high levels. CLK1 and Q2 are of low levels. T4, T5, T6, T7, T8, T11, T13, T14, T15, T17, T19, T21, T22 are turned on. T1, T2, T3, T9, T10, T12, T16, T18, T20 are turned off. In this phase, CLK2 is of a high level, so T4 is turned on. Input2 is of a high level, so T5 is turned on. The gates of T1 and T2 are connected with V2 through T4, T5, so T1, T2 are turned off. Q2 is connected with V2 through T13, T14, so Q2 is of a low level, T16, T18, T20 are turned off. The level of the electrode of C1 connected with Input2 changes from the low level in the phase of t2 to the high level in this phase. Due to the bootstrap effect of C1, the level of Q1 rises further, T15, T17, T19 are turned on completely. Output1 is connected with V1 through T15, so Output1 outputs a high level. T17 is turned on, Output2 is connected with CLK3 through T17, so Output2 outputs the clock signal of CLK3. Output3 is connected with V1 through T22, T19, so Output3 is of a high level. Q3 is connected with V1 through T21, T19, so Q3 is of a high level.

In the phase of t4, Input1, CLK1, Q1, Output1, Input2, Output3, Input3 and Q3 are of high levels. CLK2 and Q2 are of low levels. T3, T5, T7, T8, T12, T13, T14, T15, T17, T19, T21, T22 are turned on. T1, T2, T4, T6, T9, T10, T11, T16, T18, T20 are turned off. In this phase, CLK1 is of a high level, so T3 is turned on. Input2 is of a high level, so T5 is turned on. T1, T2 are turned off. Output1 is connected with V1 through T15 and outputs a high level, T17, T18 are turned on. Output2 is connected with CLK3 through T17, so Output2 outputs the clock signal of CLK3. Output3 is connected with V1 through T22, T19, so Output3 outputs a high level. Q3 is connected with V1 through T21, T19, and remains at a high level.

In the phase of t5, Input1, CLK2, Q1, Output1, Input2, Output3, Input3 and Q3 are of high levels. CLK1 and Q2 are of low levels. T4, T5, T6, T7, T8, T11, T13, T14, T15, T17, T19, T21, T22 are turned on. T1, T2, T3, T9, T10, T12, T16, T18, T20 are turned off. In this phase, the timing states of respective input signals, output signals and respective control nodes are completely same as those in the phase of t3, please make reference to the phase of t3 specifically. In order to avoid repetition, this text will not elaborate it here any more.

In the phase of t6, CLK1, Q1, Output1, Input2, Output3, Input3 and Q3 are of high levels. Input1, CLK2 and Q2 are of low levels. T3, T5, T12, T13, T14, T15, T17, T19, T21, T22 are turned on. T1, T2, T4, T6, T7, T8, T9, T10, T11, T16, T18, T20 are turned off. In this phase, Input1 is of a low level, so T7, T8 are turned off. CLK2 is of a low level, so T9, T10 still remain at the off state of the previous phase. Output1 is connected with V1 through T15, and outputs a high level. T17 is turned on, Output2 is connected with CLK3 through T17, so Output2 outputs the clock signal of CLK3. Output3 is connected with V1 through T22, T19, so Output3 outputs a high level. Q3 is connected with V1 through T21, T19, and remains at a high level.

In the phase of t7, CLK2, Q2, Input2 and Input3 are of high levels. Input1, Output1, CLK1, Output3, Q3 and Q1 are of low levels. T4, T5, T6, T9, T10, T11, T16, T18, T20 are turned on. T1, T2, T3, T7, T8, T12, T13, T14, T15, T17, T19, T21, T22 are turned off. In this phase, CLK2 is of a high level, so T6 is turned on. Input 1 is of a low level, so T7, T8 are turned off. The gates of T9, T10 are of high levels, so T9, T10 are turned on. Q1 is connected with V2 through T9, T10, so Q1 is of a low level, T15, T17, T19 are turned off, Output1 is disconnected with V1. Output1 is of a low level, hence T21, T22 are turned off, Output3 is of a low level. Output2 is connected with V2 through T18, Output2 is of a low level.

If a complete working period of a current stage GOA unit starts from the phase of t1 until Input1 of the current stage GOA unit provides a high level again, the working period of the current stage GOA unit may further have several phases after the phase of t7. This is determined by the number of rows scanned by the GOA circuit. However, after t7 and before Input1 of the current stage GOA unit provides a high level again, Output2 of the current stage GOA unit remains at its level. The number of pulses of the outputted drive signal is controlled by the length of the third phase. The figure only gives an example that the third phase includes t3-t6. In such a case, the multi-pulse signal includes five pulses. Certainly, the third phase can include more time periods by prolonging the pulse length of the frame start signal when the drive signal needs more pulses, so as to enable the drive signal outputted by the GOA unit to include more pulses.

Further, all transistors in the GOA unit in the above embodiments can also be P-type transistors that are turned on with a low level. If all transistors are P-type transistor, it only has to readjust the timing states of the respective input signals of the GOA unit. For example, the first level terminal V1 is adjusted to provide a low level, the first clock signal terminal in the phase of t1 in FIG. 5 is adjusted as a high level, the first control node in the phase of t3 is adjusted as a low level, and other signals are adjusted as timing signals with opposite phases.

Furthermore, the above GOA unit can also adopt N-type transistors and P-type transistors simultaneously. Here it has to ensure that the transistors in the GOA circuit controlled by a same timing signal or voltage are of the same type. Certainly, these are all reasonable alternative solutions that can be made by the skilled person in the art based on the embodiments of the disclosure. Therefore, all should fall within the protection scope of the disclosure. However, considering the manufacturing process of the transistor, because different types of transistors have different active layer doping materials, using the same type of transistors in the GOA circuit is more advantageous for simplifying the manufacturing process of the GOA circuit.

Figure 6:
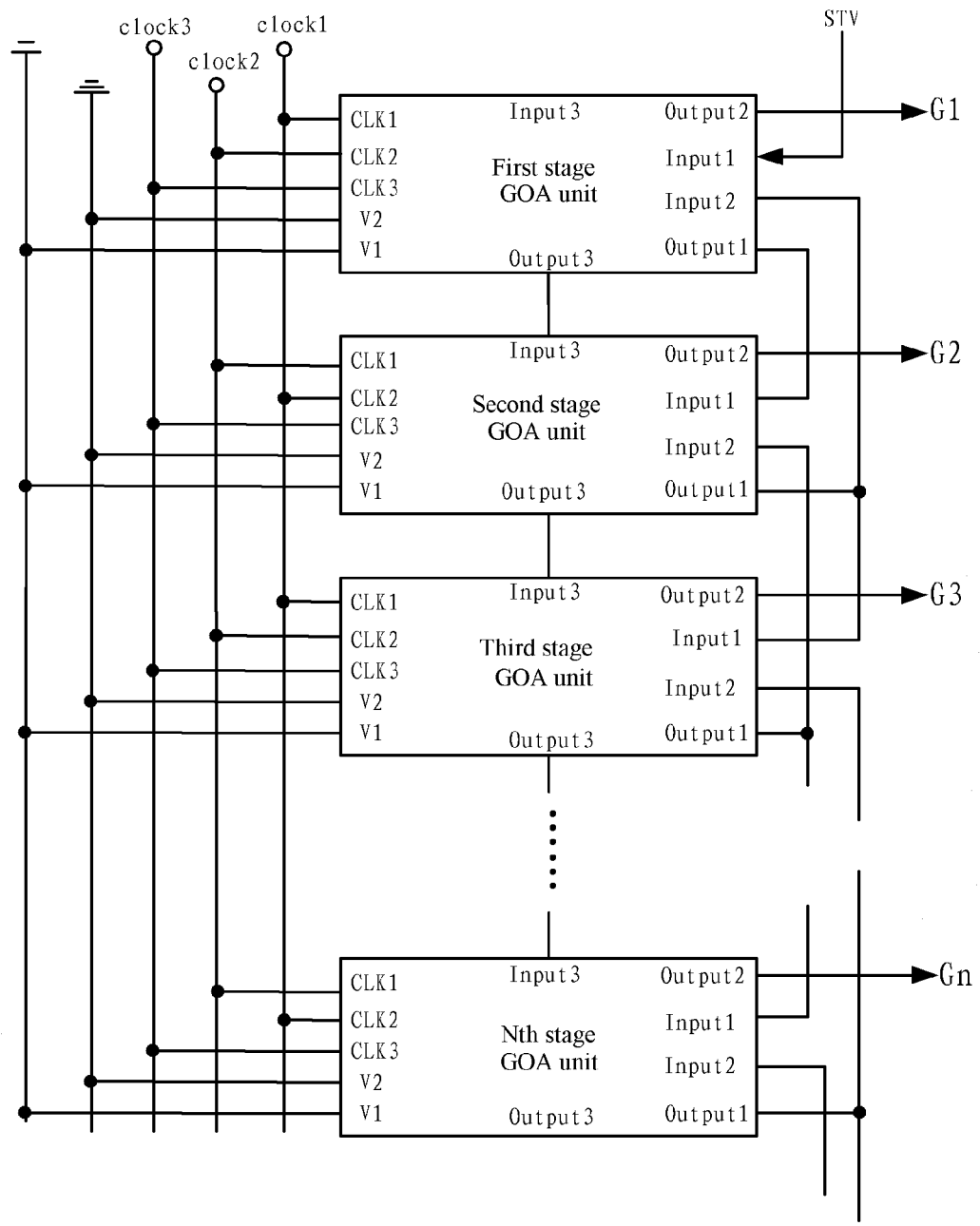
FIG. 6 is a schematic structural view of a GOA circuit provided by another embodiment of the disclosure.

As shown in FIG. 6, an embodiment of the disclosure provides a GOA circuit, comprising at least two GOA units in the above embodiments.

A first signal input terminal of a first stage GOA unit inputs a frame start signal. A second signal input terminal of the first stage GOA unit is connected with a first signal output terminal of a second stage GOA unit. A first signal output terminal of the first stage GOA unit is connected with a first signal input terminal of the second stage GOA unit. A third signal output terminal of the first stage GOA unit is connected with a third signal input terminal of the second stage GOA unit.

A first signal input terminal of a nth stage GOA unit is connected with a first signal output terminal of a (n−1)th stage GOA unit. A second signal input terminal of the nth stage GOA unit is connected with a first signal output terminal of a (n+1)th stage GOA unit. A third signal output terminal of the nth stage GOA unit is connected with a third signal input terminal of the (n+1)th stage GOA unit. A first signal output terminal of the nth stage GOA unit is connected with a first signal input terminal of the (n+1)th stage GOA unit. A first signal output terminal of the nth stage GOA unit is connected with a second signal input terminal of the (n−1)th stage GOA unit. A third signal input terminal of the nth stage GOA unit is connected with a third signal output terminal of the (n−1)th stage GOA unit; wherein n is a positive integer.

Specifically, as shown in FIG. 6, the GOA circuit comprises several cascaded GOA units. A first signal input terminal of a first stage GOA unit inputs a frame start signal. A first signal output terminal of the first stage GOA unit is connected with a first signal input terminal of a second stage GOA unit. A second signal output terminal of the first stage GOA unit is connected with a gate line G1. A second signal input terminal of the first stage GOA unit is connected with a first signal output terminal of the second stage GOA unit. A third signal output terminal of the first stage GOA unit is connected with a third signal input terminal of the second stage GOA unit. The first signal input terminal of the second stage GOA unit is connected with the first signal output terminal of the first stage GOA unit. A second signal input terminal of the second stage GOA unit is connected with a first signal output terminal of a third stage GOA unit. The first signal output terminal of the second stage GOA unit is connected with a first signal input terminal of the third stage GOA unit. The second signal output terminal of the second stage GOA unit is connected with a gate line G2. A third signal output terminal of the second stage GOA unit is connected with a third signal input terminal of the third stage GOA unit. Other GOA units of the GOA circuit are connected according to the second stage GOA unit.

Each GOA unit has one first clock signal terminal CLK1, one second clock signal terminal CLK2, one third clock signal terminal CLK3 and two level input terminals. As shown in FIG. 5, clock signals are provided to the three clock signal terminals connected with each GOA unit through three system clock signals clock1, clock2, clock3. CLK1 of the first stage GOA unit inputs clock1. CLK2 of the first stage GOA unit inputs clock2. CLK3 of the first stage GOA unit inputs clock3. CLK1 of the second stage GOA unit inputs clock2. CLK2 of the second stage GOA unit inputs clock1. CLK3 of the second stage GOA unit input clock3. For the nth stage GOA unit, when n is an odd number, the respective clock signal terminals of the nth stage GOA unit input the same clock signals as the respective clock signal terminals of the first stage GOA unit. When n is an even number, the respective clock signal terminals of the nth stage GOA unit input the same clock signals as the respective clock signal terminals of the second stage GOA unit. In FIG. 6, n is an even number, for example.

The timing states of the system clocks make reference to the first clock signal of the first clock signal terminal CLK1, the second clock signal of the second clock signal terminal CLK2, the third clock signal of the third clock signal terminal CLK3 in FIG. 5. The phases of clock1 and clock2 are opposite. The clock1 and clock2 are both clock signals with a duty ratio of 50%.

The GOA unit in the GOA circuit provided by the above embodiment controls and outputs a drive signal to the gate line through the input module, the reset module, the control module, the first output module, the second output module and the feedback module. Compared with the prior art in which the drive signal of one stage gate line is controlled and outputted by two GOA units of the same or similar structure, the drive signal of one stage gate line in embodiments of the disclosure is controlled and outputted by one GOA unit. So, with the embodiments of the disclosure, the area of the gate driving circuit may be reduced and the power consumption of the gate driving circuit may be decreased.

An embodiment of the disclosure further provides a display device, comprising the GOA circuit in any of the above embodiments.

In addition, the display device can be any product or component with the display function such as electronic paper, a mobile phone, a panel computer, a television, a display, a laptop, a digital photo frame, a navigator etc.

The GOA unit in the display device provided by the above embodiment controls and outputs a drive signal to the gate line through the input module, the reset module, the control module, the first output module, the second output module and the feedback module. Compared with the prior art in which the drive signal of one stage gate line is controlled and outputted by two GOA units of the same or similar structure, the drive signal of one stage gate line in embodiments of the disclosure is controlled and outputted by one GOA unit. So, with the embodiments of the disclosure, the area of the gate driving circuit may be reduced, and the power consumption of the gate driving circuit may be decreased.

What have been stated above are only specific embodiments of the disclosure. However, the protection scope of the disclosure is not limited to these. Any modifications or replacements that can be easily conceived by the skilled person familiar with the technical field within the technical scope disclosed by the disclosure should be encompassed within the protection scope of the disclosure. Therefore, the protection scope of the disclosure shall be subject to the protection scopes of the claims.

The invention claimed is:

1. A GOA unit, comprising: an input module, a reset module, a control module, a first output module, a second output module, and a feedback module;

wherein the input module is connected with a first signal input terminal, a second signal input terminal, a first clock signal terminal, a second clock signal terminal, a first level terminal, a second level terminal, a first control node and a third control node, for enabling a voltage of the first signal input terminal to be equal to a voltage of the first control node under the control of a second input signal of the second signal input terminal, a first clock signal of the first clock signal terminal, a second clock signal of the second clock signal terminal, a first voltage of the first level terminal, a second voltage of the second level terminal and a voltage of the third control node;

the reset module is connected with the first signal input terminal, the second clock signal terminal, the second level terminal, the first control node, the third control node and a third signal input terminal, for enabling the voltage of the first control node to be equal to the second voltage of the second level terminal under the control of a first input signal of the first signal input terminal, the second clock signal of the second clock signal terminal and a third input signal of the third signal input terminal;

the control module is connected with the first clock signal terminal, the second clock signal terminal, the first control node, the second level terminal, a second control node and the third signal input terminal, for enabling a voltage of the second control node to be equal to a voltage of the first clock signal terminal under the control of the first clock signal of the first clock signal terminal, the voltage of the first control node and the third input signal of the third signal input terminal, or enabling the voltage of the second control node to be equal to the voltage of the first clock signal terminal under the control of the second clock signal of the second clock signal terminal, the voltage of the first control node and the third input signal of the third signal input terminal, or enabling the voltage of the second control node to be equal to the second voltage of the second level terminal under the control of the voltage of the first control node;

the first output module is connected with the second signal input terminal, the first control node, the second control node, the first level terminal, the second level terminal and a first signal output terminal, for outputting the first voltage of the first level terminal at the first signal output terminal under the control of the second input signal of the second signal input terminal, the voltage of the first control node and the voltage of the second control node, or enabling a voltage of the first signal output terminal to be equal to the second voltage of the second level terminal under the control of the second control node;

the second output module is connected to the first control node, the second control node, the second level terminal, a third clock signal terminal and a second signal output terminal, for outputting a third clock signal of the third clock signal terminal at the second signal output terminal under the control of the voltage of the first control node, or enabling the second voltage of the second level terminal to be equal to a voltage of the second signal output terminal under the control of the voltage of the second control node;

the feedback module is connected with the first signal output terminal, the first control node, the second control node, the first level terminal, the second level terminal, a third signal output terminal and the third control node, for enabling a voltage of the third control node to be equal to the first voltage of the first level terminal and outputting the first voltage of the first level terminal at the third signal output terminal under the control of the voltage of the first control node, the voltage of the second control node and the voltage of the first signal output terminal.

2. The GOA unit according to claim 1, wherein the input module comprises: a first transistor, a second transistor, a third transistor, a fourth transistor and a fifth transistor;

wherein a first terminal of the first transistor is connected with the first signal input terminal, a second terminal of the first transistor is connected with the third control node, a gate of the first transistor is connected with a gate of the second transistor;

a first terminal of the second transistor is connected with the third control node, a second terminal of the second transistor is connected with the first control node, the gate of the second transistor is connected with a second terminal of the third transistor;

a first terminal of the third transistor is connected with the first level terminal, the second terminal of the third transistor is connected with a first terminal of the fourth transistor, a gate of the third transistor is connected with the first clock signal terminal;

the first terminal of the fourth transistor is connected with a first terminal of the fifth transistor, a second terminal of the fourth transistor is connected with a second terminal of the fifth transistor, a gate of the fourth transistor is connected with the second clock signal terminal;

the second terminal of the fifth transistor is connected with the second level terminal, a gate of the fifth transistor is connected with the second signal input terminal.

3. The GOA unit according to claim 1, wherein the reset module comprises: a sixth transistor, a seventh transistor, an eighth transistor, a ninth transistor and a tenth transistor;

wherein a first terminal of the sixth transistor is connected with a gate of the sixth transistor, a second terminal of the sixth transistor is connected with a first terminal of the seventh transistor, the gate of the sixth transistor is connected with the second clock signal terminal;

a second terminal of the seventh transistor is connected with a first terminal of the eighth transistor, a gate of the seventh transistor is connected with a gate of the eighth transistor;

the first terminal of the eighth transistor is connected with the third signal input terminal, a second terminal of the eighth transistor is connected with the second level terminal, the gate of the eighth transistor is connected with the first signal input terminal;

a first terminal of the ninth transistor is connected with the first control node, a second terminal of the ninth transistor is connected with a first terminal of the tenth transistor, a gate of the ninth transistor is connected with a gate of the tenth transistor;

the first terminal of the tenth transistor is connected with the third control node, a second terminal of the tenth transistor is connected with the second level terminal, the gate of the tenth transistor is connected with the second terminal of the sixth transistor.

4. The GOA unit according to claim 1, wherein the control module comprises: an eleventh transistor, a twelfth transistor, a thirteenth transistor and a fourteenth transistor;

wherein a first terminal of the eleventh transistor is connected with a gate of the eleventh transistor, a second terminal of the eleventh transistor is connected with a second terminal of the twelfth transistor, the gate of the eleventh transistor is connected with the second clock signal terminal;

a first terminal of the twelfth transistor is connected with a gate of the twelfth transistor, the second terminal of the twelfth transistor is connected with a first terminal of the thirteenth transistor, the gate of the twelfth transistor is connected with the first clock signal terminal;

a first terminal of the thirteenth transistor is connected with the second control node, a second terminal of the thirteenth transistor is connected with a first terminal of the fourteenth transistor, a gate of the thirteenth transistor is connected with a gate of the fourteenth transistor;

the first terminal of the fourteenth transistor is connected with the third signal input terminal, a second terminal of the fourteenth transistor is connected with the second level terminal, the gate of the fourteenth transistor is connected with the first control node.

5. The GOA unit according to claim 1, wherein the first output module comprises: a first capacitor, a second capacitor, a fifteenth transistor and a sixteenth transistor;

wherein a first electrode of the first capacitor is connected with the second signal input terminal, a second electrode of the first capacitor is connected with a first electrode of the second capacitor;

the first electrode of the second capacitor is connected with the first control node, a second electrode of the second capacitor is connected with a second terminal of the fifteenth transistor;

a first terminal of the fifteenth transistor is connected with the first level terminal, the second terminal of the fifteenth transistor is connected with the first signal output terminal, a gate of the fifteenth transistor is connected with the first control node;

a first terminal of the sixteenth transistor is connected with the first signal output terminal, a second terminal of the sixteenth transistor is connected with the second level terminal, a gate of the sixteenth transistor is connected with the second control node.

6. The GOA unit according to claim 1, wherein the second output module comprises: a seventeenth transistor and an eighteenth transistor;

wherein a first terminal of the seventeenth transistor is connected with the third clock signal terminal; a second terminal of the seventeenth transistor is connected with the second signal output terminal, a gate of the seventeenth transistor is connected with the first control node;

a first terminal of the eighteenth transistor is connected with the second signal output terminal, a second terminal of the eighteenth transistor is connected with the second level terminal, a gate of the eighteenth transistor is connected with the second control node.

7. The GOA unit according to claim 1, wherein the feedback module comprises: a nineteenth transistor, a twentieth transistor, a twenty-first transistor and a twenty-second transistor;

wherein a first terminal of the nineteenth transistor is connected with the first level terminal, a second terminal of the nineteenth transistor is connected with a first terminal of the twentieth transistor, a gate of the nineteenth transistor is connected with the first control node;

the first terminal of the twentieth transistor is connected with a first terminal of the twenty-first transistor, a second terminal of the twentieth transistor is connected with the second level terminal, a gate of the twentieth transistor is connected with the second control node;

the first terminal of the twenty-first transistor is connected with a first terminal of the twenty-second transistor, a second terminal of the twenty-first transistor is connected with the third control node, a gate of the twenty-first transistor is connected with a gate of the twenty-second transistor;

a second terminal of the twenty-second transistor is connected with the third signal output terminal, the gate of the twenty-second transistor is connected with the first signal output terminal.

8. The GOA unit according to claim 2, wherein the transistors are all N-type transistors; or the transistors are all P-type transistors.

9. The GOA unit according to claim 1, wherein the first clock signal of the first clock signal terminal and the second clock signal of the second clock signal terminal have opposite phases, and the first clock signal of the first clock signal terminal and the second clock signal of the second clock signal terminal both have a duty ratio of 50%.

10. A GOA circuit, comprising: at least two GOA units according to claim 1;

wherein a first signal input terminal of a first stage GOA unit inputs a frame start signal, a second signal input terminal of the first stage GOA unit is connected with a first signal output terminal of a second stage GOA unit, a first signal output terminal of the first stage GOA unit is connected with a first signal input terminal of the second stage GOA unit, a third signal output terminal of the first stage GOA unit is connected with a third signal input terminal of the second stage GOA unit;

a first signal input terminal of a nth stage GOA unit is connected with a first signal output terminal of a (n−1)th stage GOA unit, a second signal input terminal of the nth stage GOA unit is connected with a first signal output terminal of a (n+1)th stage GOA unit, a third signal output terminal of the nth stage GOA unit is connected with a third signal input terminal of the (n+1)th stage GOA unit, a first signal output terminal of the nth stage GOA unit is connected with a first signal input terminal of the (n+1)th stage GOA unit, a first signal output terminal of the nth stage GOA unit is connected with a second signal input terminal of the (n−1)th stage GOA unit, a third signal input terminal of the nth stage GOA unit is connected with a third signal output terminal of the (n−1)th stage GOA unit; wherein n is a positive integer.

11. A display device, comprising: the GOA circuit according to claim 10.

12. A method for driving a GOA unit, comprising:

a first phase, in which a control module enables a voltage of a second control node to be equal to a voltage of a second clock signal terminal under the control of a second clock signal of the second clock signal terminal and a voltage of a first control node; a first output module enables a second voltage of a second level terminal to be equal to a voltage of a first signal output terminal under the control of the voltage of the second control node; a second output module enables the second voltage of the second level terminal to be equal to a voltage of a second signal output terminal under the control of the voltage of the second control node;

a second phase, in which an input module enables a voltage of a first signal input terminal to be equal to the voltage of the first control node under the control of a second input signal of a second signal input terminal, the first clock signal of the first clock signal terminal, a second clock signal of a second clock signal terminal, a first voltage of a first level terminal and the second voltage of the second level terminal; the first output module outputs the first voltage of the first level terminal at the first signal output terminal under the control of the second input signal of the second signal input terminal, the voltage of the first control node and the voltage of the second control node; the second output module outputs a third clock signal of a third clock signal terminal at the second signal output terminal under the control of the voltage of the first control node; a feedback module enables the first voltage of the first level terminal to be equal to a voltage of a third signal output terminal under the control of the voltage of the first control node and the voltage of the first signal output terminal;

a third phase, in which the first output module outputs the first voltage of the first level terminal at the first signal output terminal under the control of the second input signal of the second signal input terminal, the voltage of the first control node, the voltage of the second control node and a voltage of a third control node; the second output module outputs the third clock signal of the third clock signal terminal at the second signal output terminal under the control of the voltage of the first control node and the voltage of the third control node; the feedback module enables the first voltage of the first level terminal to be equal to the voltage of the third signal output terminal under the control of the voltage of the first control node and the voltage of the first signal output terminal;

a fourth phase, in which a reset module enables the voltage of the first control node to be equal to the second voltage of the second level terminal under the control of the first input signal of the first signal input terminal, the second clock signal of the second clock signal terminal and a third input signal of a third signal input terminal; the first signal output terminal enables the voltage of the first signal output terminal to be equal to the second voltage of the second level terminal under the control of the second control node; the second signal output terminal enables the second voltage of the second level terminal to be equal to the voltage of the second signal output terminal under the control of the voltage of the second control node.

13. The method according to claim 12, wherein the input module comprises: a first transistor, a second transistor, a third transistor, a fourth transistor and a fifth transistor;

wherein a first terminal of the first transistor is connected with the first signal input terminal, a second terminal of the first transistor is connected with the third control node, a gate of the first transistor is connected with a gate of the second transistor;

a first terminal of the second transistor is connected with the third control node, a second terminal of the second transistor is connected with the first control node, the gate of the second transistor is connected with a second terminal of the third transistor;

a first terminal of the third transistor is connected with the first level terminal, the second terminal of the third transistor is connected with a first terminal of the fourth transistor, a gate of the third transistor is connected with the first clock signal terminal;

the first terminal of the fourth transistor is connected with a first terminal of the fifth transistor, a second terminal of the fourth transistor is connected with a second terminal of the fifth transistor, a gate of the fourth transistor is connected with the second clock signal terminal;

the second terminal of the fifth transistor is connected with the second level terminal, a gate of the fifth transistor is connected with the second signal input terminal;

the third phase comprises 2n time periods, wherein n is a positive integer greater than one, the method further comprises:

in the first phase, the first transistor is in an off state, the second transistor is in an off state, the third transistor is in an off state, the fourth transistor is in an on state, the fifth transistor is in an off state;

in the second phase, the first transistor is in an on state, the second transistor is in an on state, the third transistor is in an on state, the fourth transistor is in an off state, the fifth transistor is in an off state;

in odd time periods of the third phase, the first transistor is in an off state, the second transistor is in an off state, the third transistor is in an off state, the fourth transistor is in an on state, the fifth transistor is in an on state;

in even time periods except for the 2nth time period of the third phase, the first transistor is in an off state, the second transistor is in an off state, the third transistor is in an on state, the fourth transistor is in an off state, the fifth transistor is in an on state;

in the 2nth time period of the third phase, the first transistor is in an off state, the second transistor is in an off state, the third transistor is in an on state, the fourth transistor is in an off state, the fifth transistor is in an on state;

in the fourth phase, the first transistor is in an off state, the second transistor is in an off state, the third transistor is in an off state, the fourth transistor is in an on state, the fifth transistor is in an on state.

14. The method according to claim 12, wherein the reset module comprises: a sixth transistor, a seventh transistor, an eighth transistor, a ninth transistor and a tenth transistor;

wherein a first terminal of the sixth transistor is connected with a gate of the sixth transistor, a second terminal of the sixth transistor is connected with a first terminal of the seventh transistor, the gate of the sixth transistor is connected with the second clock signal terminal;

a second terminal of the seventh transistor is connected with a first terminal of the eighth transistor, a gate of the seventh transistor is connected with a gate of the eighth transistor;

the first terminal of the eighth transistor is connected with the third signal input terminal, a second terminal of the eighth transistor is connected with the second level terminal, the gate of the eighth transistor is connected with the first signal input terminal;

a first terminal of the ninth transistor is connected with the first control node, a second terminal of the ninth transistor is connected with a first terminal of the tenth transistor, a gate of the ninth transistor is connected with a gate of the tenth transistor;

the first terminal of the tenth transistor is connected with the third control node, a second terminal of the tenth transistor is connected with the second level terminal, the gate of the tenth transistor is connected with the second terminal of the sixth transistor;

the third phase comprises 2n time periods, wherein n is a positive integer greater than one, the method further comprises:

in the first phase, the sixth transistor is in an on state, the seventh transistor is in an on state, the eighth transistor is in an on state, the ninth transistor is in an off state, the tenth transistor is in an off state;

in the second phase, the sixth transistor is in an off state, the seventh transistor is in an on state, the eighth transistor is in an on state, the ninth transistor is in an off state, the tenth transistor is in an off state;

in odd time periods of the third phase, the sixth transistor is in an on state, the seventh transistor is in an on state, the eighth transistor is in an on state, the ninth transistor is in an off state, the tenth transistor is in an off state;

in even time periods except for the 2nth time period of the third phase, the sixth transistor is in an off state, the seventh transistor is in an on state, the eighth transistor is in an on state, the ninth transistor is in an off state, the tenth transistor is in an off state;

in the 2nth time period of the third phase, the sixth transistor is in an off state, the seventh transistor is in an off state, the eighth transistor is in an off state, the ninth transistor is in an off state, the tenth transistor is in an off state;

in the fourth phase, the sixth transistor is in an on state, the seventh transistor is in an off state, the eighth transistor is in an off state, the ninth transistor is in an on state, the tenth transistor is in an on state.

15. The method according to claim 12, wherein the control module comprises: an eleventh transistor, a twelfth transistor, a thirteenth transistor and a fourteenth transistor;

wherein a first terminal of the eleventh transistor is connected with a gate of the eleventh transistor, a second terminal of the eleventh transistor is connected with a second terminal of the twelfth transistor, the gate of the eleventh transistor is connected with the second clock signal terminal;

a first terminal of the twelfth transistor is connected with a gate of the twelfth transistor, the second terminal of the twelfth transistor is connected with a first terminal of the thirteenth transistor, the gate of the twelfth transistor is connected with the first clock signal terminal;

a first terminal of the thirteenth transistor is connected with the second control node, a second terminal of the thirteenth transistor is connected with a first terminal of the fourteenth transistor, a gate of the thirteenth transistor is connected with a gate of the fourteenth transistor;

the first terminal of the fourteenth transistor is connected with the third signal input terminal, a second terminal of the fourteenth transistor is connected with the second level terminal, the gate of the fourteenth transistor is connected with the first control node;

the third phase comprises 2n time periods, wherein n is a positive integer greater than one, the method further comprises:

in the first phase, the eleventh transistor is in an on state, the twelfth transistor is in an off state, the thirteenth transistor is in an off state, the fourteenth transistor is in an off state;

in the second phase, the eleventh transistor is in an off state, the twelfth transistor is in an on state, the thirteenth transistor is in an on state, the fourteenth transistor is in an on state;

in odd time periods of the third phase, the eleventh transistor is in an on state, the twelfth transistor is in an off state, the thirteenth transistor is in an on state, the fourteenth transistor is in an on state;

in even time periods except for the 2nth time period of the third phase, the eleventh transistor is in an off state, the twelfth transistor is in an on state, the thirteenth transistor is in an on state, the fourteenth transistor is in an on state;

in the 2nth time period of the third phase, the eleventh transistor is in an off state, the twelfth transistor is in an on state, the thirteenth transistor is in an on state, the fourteenth transistor is in an on state;

in the fourth phase, the eleventh transistor is in an on state, the twelfth transistor is in an off state, the thirteenth transistor is in an off state, the fourteenth transistor is in an off state.

16. The method according to claim 12, wherein the first output module comprises: a first capacitor, a second capacitor, a fifteenth transistor and a sixteenth transistor;

wherein a first electrode of the first capacitor is connected with the second signal input terminal, a second electrode of the first capacitor is connected with a first electrode of the second capacitor;

the first electrode of the second capacitor is connected with the first control node, a second electrode of the second capacitor is connected with a second terminal of the fifteenth transistor;

a first terminal of the fifteenth transistor is connected with the first level terminal, the second terminal of the fifteenth transistor is connected with the first signal output terminal, a gate of the fifteenth transistor is connected with the first control node;

a first terminal of the sixteenth transistor is connected with the first signal output terminal, a second terminal of the sixteenth transistor is connected with the second level terminal, a gate of the sixteenth transistor is connected with the second control node;

the third phase comprises 2n time periods, wherein n is a positive integer greater than one, the method further comprises:

in the first phase, the fifteenth transistor is in an off state, the sixteenth transistor is in an on state;

in the second phase, the fifteenth transistor is in an on state, the sixteenth transistor is in an off state;

in odd time periods of the third phase, the fifteenth transistor is in an on state, the sixteenth transistor is in an off state;

in even time periods except for the 2nth time period of the third phase, the fifteenth transistor is in an on state, the sixteenth transistor is in an off state;

in the 2nth time period of the third phase, the fifteenth transistor is in an on state, the sixteenth transistor is in an off state;

in the fourth phase, the fifteenth transistor is in an off state, the sixteenth transistor is in an on state.

17. The method according to claim 12, wherein the second output module comprises: a seventeenth transistor and an eighteenth transistor;
- wherein a first terminal of the seventeenth transistor is connected with the third clock signal terminal; a second terminal of the seventeenth transistor is connected with the second signal output terminal, a gate of the seventeenth transistor is connected with the first control node;
- a first terminal of the eighteenth transistor is connected with the second signal output terminal, a second terminal of the eighteenth transistor is connected with the second level terminal, a gate of the eighteenth transistor is connected with the second control node;
- the third phase comprises 2n time periods, wherein n is a positive integer greater than one, the method further comprises:
- in the first phase, the seventeenth transistor is in an off state, the eighteenth transistor is in an on state;
- in the second phase, the seventeenth transistor is in an on state, the eighteenth transistor is in an off state;
- in odd time periods of the third phase, the seventeenth transistor is in an on state, the eighteenth transistor is in an off state;
- in even time periods except for the 2nth time period of the third phase, the seventeenth transistor is in an on state, the eighteenth transistor is in an off state;
- in the 2nth time period of the third phase, the seventeenth transistor is in an on state, the eighteenth transistor is in an off state;
- in the fourth phase, the seventeenth transistor is in an off state, the eighteenth transistor is in an on state.

18. The method according to claim 12, wherein the feedback module comprises: a nineteenth transistor, a twentieth transistor, a twenty-first transistor and a twenty-second transistor;
- wherein a first terminal of the nineteenth transistor is connected with the first level terminal, a second terminal of the nineteenth transistor is connected with a first terminal of the twentieth transistor, a gate of the nineteenth transistor is connected with the first control node;
- the first terminal of the twentieth transistor is connected with a first terminal of the twenty-first transistor, a second terminal of the twentieth transistor is connected with the second level terminal, a gate of the twentieth transistor is connected with the second control node;
- the first terminal of the twenty-first transistor is connected with a first terminal of the twenty-second transistor, a second terminal of the twenty-first transistor is connected with the third control node, a gate of the twenty-first transistor is connected with a gate of the twenty-second transistor;
- a second terminal of the twenty-second transistor is connected with the third signal output terminal, the gate of the twenty-second transistor is connected with the first signal output terminal;
- the third phase comprises 2n time periods, wherein n is a positive integer greater than one, the method further comprises:
- in the first phase, the nineteenth transistor is in an off state, the twentieth transistor is in an on state, the twenty-first transistor is in an off state, the twenty-second transistor is in an off state;
- in the second phase, the nineteenth transistor is in an on state, the twentieth transistor is in an off state, the twenty-first transistor is in an on state, the twenty-second transistor is in an on state;
- in odd time periods of the third phase, the nineteenth transistor is in an on state, the twentieth transistor is in an off state, the twenty-first transistor is in an on state, the twenty-second transistor is in an on state;
- in even time periods except for the 2nth time period of the third phase, the nineteenth transistor is in an on state, the twentieth transistor is in an off state, the twenty-first transistor is in an on state, the twenty-second transistor is in an on state;
- in the 2nth time period of the third phase, the nineteenth transistor is in an on state, the twentieth transistor is in an off state, the twenty-first transistor is in an on state, the twenty-second transistor is in an on state;
- in the fourth phase, the nineteenth transistor is in an off state, the twentieth transistor is in an on state, the twenty-first transistor is in an off state, the twenty-second transistor is in an off state.

19. The method according to claim 13, wherein the transistors are all N-type transistors; or the transistors are all P-type transistors.

20. The method according to claim 12, wherein the first clock signal of the first clock signal terminal and the second clock signal of the second clock signal terminal have opposite phases, and the first clock signal of the first clock signal terminal and the second clock signal of the second clock signal terminal both have a duty ratio of 50%.

* * * * *